US012040436B2

(12) United States Patent
Konishi

(10) Patent No.: US 12,040,436 B2
(45) Date of Patent: Jul. 16, 2024

(54) PHOSPHOR SUBSTRATE, LIGHT EMITTING SUBSTRATE, AND LIGHTING DEVICE

(71) Applicant: DENKA COMPANY LIMITED, Tokyo (JP)

(72) Inventor: Masahiro Konishi, Omuta (JP)

(73) Assignee: DENKA COMPANY LIMITED, Tokyo (JP)

(*) Notice: Subject to any disclaimer, the term of this patent is extended or adjusted under 35 U.S.C. 154(b) by 494 days.

(21) Appl. No.: 17/414,643

(22) PCT Filed: Dec. 18, 2019

(86) PCT No.: PCT/JP2019/049691
§ 371 (c)(1),
(2) Date: Jun. 16, 2021

(87) PCT Pub. No.: WO2020/137764
PCT Pub. Date: Jul. 2, 2020

(65) Prior Publication Data
US 2022/0052233 A1 Feb. 17, 2022

(30) Foreign Application Priority Data
Dec. 27, 2018 (JP) .................. 2018-244546

(51) Int. Cl.
*H01L 33/00* (2010.01)
*H01L 25/04* (2023.01)
(Continued)

(52) U.S. Cl.
CPC ............ *H01L 33/62* (2013.01); *H01L 25/042* (2013.01); *H01L 33/50* (2013.01); *H01L 2933/0066* (2013.01)

(58) Field of Classification Search
None
See application file for complete search history.

(56) References Cited

U.S. PATENT DOCUMENTS 7,391,060 B2   6/2008  Oshio
7,825,575 B2  11/2010  Sawanobori et al.
(Continued)

FOREIGN PATENT DOCUMENTS

CN   1967888 A   5/2007
CN  102074558 A   5/2011
(Continued)

OTHER PUBLICATIONS

Oct. 14, 2022 Search Report issued in European Patent Application No. 19901970.4.
(Continued)

*Primary Examiner* — Bradley Smith
(74) *Attorney, Agent, or Firm* — Oliff PLC

(57) ABSTRACT

A phosphor substrate having a plurality of light emitting elements mounted on one surface, and includes an insulating substrate, a first electrode group which is disposed on one surface of the insulating substrate and includes a plurality of electrodes bonded to the plurality of light emitting elements, and a phosphor layer which is disposed on one surface of the insulating substrate and includes a phosphor in which a light emission peak wavelength, in a case where light emitted by the light emitting element is used as excitation light, is in a visible light region, and the insulating substrate contains a bismaleimide resin and glass cloth.

13 Claims, 15 Drawing Sheets

(51) Int. Cl.
  *H01L 33/50*  (2010.01)
  *H01L 33/62*  (2010.01)

(56) References Cited

U.S. PATENT DOCUMENTS

| | | | |
|---|---|---|---|
| 8,143,634 B2 | 3/2012 | Park et al. |
| 8,232,709 B2 | 7/2012 | Betsuda et al. |
| 8,558,438 B2 | 10/2013 | Zimmerman et al. |
| 8,563,338 B2 | 10/2013 | Park et al. |
| 8,680,546 B2 | 3/2014 | Konishi et al. |
| 8,704,258 B2 | 4/2014 | Tasaki et al. |
| 8,772,807 B2 | 7/2014 | Lin |
| 8,796,713 B2 | 8/2014 | Lin |
| 8,835,970 B2 | 9/2014 | Konishi et al. |
| 9,006,006 B2 | 4/2015 | Konishi |
| 9,178,125 B2 | 11/2015 | Konishi et al. |
| 9,341,563 B2 | 5/2016 | Amari |
| 9,461,224 B2 | 10/2016 | Konishi et al. |
| 9,553,245 B2 | 1/2017 | Kamada |
| 9,574,050 B2 | 2/2017 | Tasaki et al. |
| 9,673,364 B2 | 6/2017 | Nakabayashi |
| 9,681,502 B2 | 6/2017 | Oyamada et al. |
| 9,728,691 B2 | 8/2017 | Liaw |
| 9,874,318 B2 | 1/2018 | Su et al. |
| 9,960,332 B2 | 5/2018 | Konishi et al. |
| 9,978,915 B2 | 5/2018 | Weng et al. |
| 10,128,421 B2 | 11/2018 | Nakabayashi |
| 10,230,032 B2 | 3/2019 | Baike |
| 10,347,798 B2 | 7/2019 | Dai et al. |
| 10,522,729 B2 | 12/2019 | Nakabayashi |
| 10,533,094 B2 | 1/2020 | Tasaki et al. |
| 10,755,856 B2 | 8/2020 | Kim et al. |
| 10,797,209 B2 | 10/2020 | Chen et al. |
| 10,825,695 B2 | 11/2020 | Baike |
| 10,916,496 B2 | 2/2021 | Kita |
| 2005/0139851 A1 | 6/2005 | Sato |
| 2007/0064131 A1 | 3/2007 | Sawanobori et al. |
| 2007/0259206 A1 | 11/2007 | Oshio |
| 2009/0050909 A1 | 2/2009 | Chen et al. |
| 2009/0072256 A1 | 3/2009 | Park et al. |
| 2009/0217970 A1 | 9/2009 | Zimmerman et al. |
| 2009/0315057 A1 | 12/2009 | Konishi et al. |
| 2010/0238648 A1* | 9/2010 | Tsukahara | G02F 1/133603 |
| | | | 362/231 |
| 2011/0084300 A1 | 4/2011 | Park |
| 2011/0089805 A1 | 4/2011 | Betsuda et al. |
| 2012/0080702 A1 | 4/2012 | Lin |
| 2012/0080703 A1 | 4/2012 | Lin |
| 2012/0138997 A1 | 6/2012 | Tasaki et al. |
| 2012/0142127 A1 | 6/2012 | Park et al. |
| 2013/0011617 A1 | 1/2013 | Tasaki et al. |
| 2013/0161662 A1 | 6/2013 | Imai |
| 2014/0159092 A1 | 6/2014 | Konishi et al. |
| 2014/0361331 A1 | 12/2014 | Konishi et al. |
| 2015/0001563 A1 | 1/2015 | Miki |
| 2015/0008462 A1 | 1/2015 | Weng et al. |
| 2015/0021642 A1 | 1/2015 | Nakabayashi |
| 2015/0049481 A1 | 2/2015 | Oyamada et al. |
| 2015/0060911 A1 | 3/2015 | Chien et al. |
| 2015/0155441 A1 | 6/2015 | Alexeev et al. |
| 2015/0185137 A1 | 7/2015 | Amari |
| 2015/0228869 A1 | 8/2015 | Yoo et al. |
| 2015/0276152 A1 | 10/2015 | Su et al. |
| 2016/0005939 A1* | 1/2016 | Andrews | H01L 33/62 |
| | | | 257/91 |
| 2016/0013387 A1 | 1/2016 | Konishi et al. |
| 2016/0064628 A1 | 3/2016 | Fujii et al. |
| 2016/0161067 A1 | 6/2016 | Oepts et al. |
| 2016/0190408 A1 | 6/2016 | Kamada |
| 2016/0219690 A1 | 7/2016 | Toh |
| 2016/0359095 A1 | 12/2016 | Konishi et al. |
| 2017/0025582 A1 | 1/2017 | Dai et al. |
| 2017/0025588 A1 | 1/2017 | Weng et al. |
| 2017/0054063 A1 | 2/2017 | Liaw |
| 2017/0084799 A1 | 3/2017 | Ouderkirk et al. |
| 2017/0114226 A1 | 4/2017 | Tasaki et al. |
| 2017/0196060 A1 | 7/2017 | Watanabe et al. |
| 2017/0229621 A1 | 8/2017 | Chen et al. |
| 2017/0236981 A1 | 8/2017 | Nakabayashi |
| 2017/0317250 A1 | 11/2017 | Konishi et al. |
| 2018/0033929 A1 | 2/2018 | Baike |
| 2019/0035716 A1 | 1/2019 | Kita |
| 2019/0081222 A1 | 3/2019 | Nakabayashi |
| 2019/0172989 A1 | 6/2019 | Baike |
| 2019/0227672 A1* | 7/2019 | Nishimura | G06F 3/0445 |
| 2020/0091384 A1 | 3/2020 | Nakabayashi |
| 2020/0092994 A1* | 3/2020 | Toshimitsu | H05K 1/0271 |
| 2020/0095430 A1 | 3/2020 | Tasaki et al. |
| 2020/0350122 A1* | 11/2020 | Kim | H01G 4/012 |

FOREIGN PATENT DOCUMENTS

| | | |
|---|---|---|
| CN | 103346241 A | 10/2013 |
| CN | 103579480 A | 2/2014 |
| CN | 103904072 A | 7/2014 |
| CN | 203839375 U | 9/2014 |
| CN | 106163113 A | 11/2016 |
| CN | 106356439 A | 1/2017 |
| CN | 109075131 A | 12/2018 |
| CN | 101606247 A | 12/2019 |
| EP | 3 546 825 A1 | 10/2019 |
| EP | 3 546 895 A1 | 10/2019 |
| JP | H10-151794 A | 6/1998 |
| JP | 2000-11953 A | 1/2000 |
| JP | 2001-148509 A | 5/2001 |
| JP | 2001-148512 A | 5/2001 |
| JP | 2003-258311 A | 9/2003 |
| JP | 2006-049799 A | 2/2006 |
| JP | 2006-261688 A | 9/2006 |
| JP | 2007-080994 A | 3/2007 |
| JP | 2008-066691 A | 3/2008 |
| JP | 2009-071264 A | 4/2009 |
| JP | 2009-267289 A | 11/2009 |
| JP | 2010-034487 A | 2/2010 |
| JP | 2012-094578 A | 5/2012 |
| JP | 2012-146942 A | 8/2012 |
| JP | 2012-186274 A | 9/2012 |
| JP | 2013-012607 A | 1/2013 |
| JP | 2013-115368 A | 6/2013 |
| JP | 2014-003065 A | 1/2014 |
| JP | 2014-220431 A | 11/2014 |
| JP | 2015-037170 A | 2/2015 |
| JP | 2015-038963 A | 2/2015 |
| JP | 2015-103632 A | 6/2015 |
| JP | 2015-198252 A | 11/2015 |
| JP | 2015-216139 A | 12/2015 |
| JP | 2016-069401 A | 5/2016 |
| JP | 2016-122693 A | 7/2016 |
| JP | 2016-139632 A | 8/2016 |
| JP | 2016-525798 A | 8/2016 |
| JP | 2017-041621 A | 2/2017 |
| JP | 2017-058635 A | 3/2017 |
| JP | 2017-175118 A | 9/2017 |
| JP | 2018-018979 A | 2/2018 |
| JP | 2018-082027 A | 5/2018 |
| JP | 2018-191006 A | 11/2018 |
| JP | 2019-093339 A | 6/2019 |
| KR | 10-2013-0104975 A | 9/2013 |
| TW | 200903843 A | 1/2009 |
| TW | 200910630 A | 3/2009 |
| TW | 201214786 A | 4/2012 |
| TW | M496850 U | 3/2015 |
| TW | 201532304 A | 8/2015 |
| TW | 201709563 A | 3/2017 |
| WO | 2010/150880 A1 | 12/2010 |
| WO | 2013/153739 A1 | 10/2013 |
| WO | 2014/181757 A1 | 11/2014 |
| WO | 2018/059599 A1 | 4/2018 |

OTHER PUBLICATIONS

Sep. 26, 2023 Notice of Allowance issued in U.S. Appl. No. 17/415,433.

(56) References Cited

OTHER PUBLICATIONS

Oct. 18, 2023 Office Action issued in U.S. Appl. No. 17/415,443.
Kuboyama et al.; "An approach to the thermal expansion coefficient of IC chips and excellent cost performance;" Rishio News; 2014; pp. 7-9; No. 192.
Mar. 24, 2020 Search Report issued in International Patent Application No. PCT/JP2019/049691.
Nov. 1, 2023 Office Action issued in U.S. Appl. No. 17/415,448.
Oct. 31, 2023 Office Action issued in Japanese Patent Application No. 2020-563142.
Oct. 31, 2023 Office Action issued in Japanese Patent Application No. 2020-563145.
Nov. 20, 2023 Office Action issued in U.S. Appl. No. 17/415,373.
Jul. 18, 2023 Office Action Issued in Japanese Patent Application No. 2020-563143.
Mar. 6, 2023, Office Action issued in Taiwanese Patent Application No. 108147178.
Mar. 30, 2023, Office Action issued in Taiwanese Patent Application No. 108147182.
Mar. 11, 2022 Extended European Search Report issued in European Application No. 19905139.2.
Jan. 19, 2022 extended Search Report issued in European Patent Application No. 19905946.0.
Jan. 18, 2022 extended Search Report issued in European Patent Application No. 19901970.4.
Jan. 18, 2022 extended Search Report issued in European Patent Application No. 19904664.0.
Jan. 18, 2022 extended Search Report issued in European Patent Application No. 19904987.5.
Mar. 17, 2020 Search Report issued in International Patent Application No. PCT/JP2019/049689.
Mar. 3, 2020 Search Report issued in International Patent Application No. PCT/JP2019/049690.
Mar. 17, 2020 Search Report issued in International Patent Application No. PCT/JP2019/049688.
Mar. 17, 2020 Search Report issued in International Patent Application No. PCT/JP2019/049687.
U.S. Appl. No. 17/415,443, filed Jun. 17, 2021 in the name of Konishi.
U.S. Appl. No. 17/415,448, filed Jun. 17, 2021 in the name of Konishi.
U.S. Appl. No. 17/415,433, filed Jun. 17, 2021 in the name of Konishi.
U.S. Appl. No. 17/415,373, filed Jun. 17, 2021 in the name of Konishi.
Dec. 22, 2023 Office Action issued in Chinese Patent Application No. 201980083426.9.
Jan. 19, 2024 Office Action issued in Taiwanese Patent Application No. 108147166.
Feb. 5, 2024 Office Action issued in Chinese Patent Application No. 201980085497.2.
Mar. 1, 2024 Office Action issued in Taiwanese Patent Application No. 108147178.
Tang An et al., "White LED Study on the luminescence properties of red phosphor," Intellectual Property Publishing House, Aug. 31, 2016, pp. 2-6 with partial English translation.
Dec. 5, 2023 Notice of Allowance issued in Japanese Patent Application No. 2020-563143.
Apr. 1, 2024 Notice of Allowance issued in U.S. Appl. No. 17/415,443.
Apr. 15, 2024 Corrected Notice of Allowability issued in U.S. Appl. No. 17/415,443.
May 7, 2024 Notice of Allowance issued in Japanese Patent Application No. 2020-563141.
May 1, 2024 Office Action issued in U.S. Appl. No. 17/415,373.

* cited by examiner

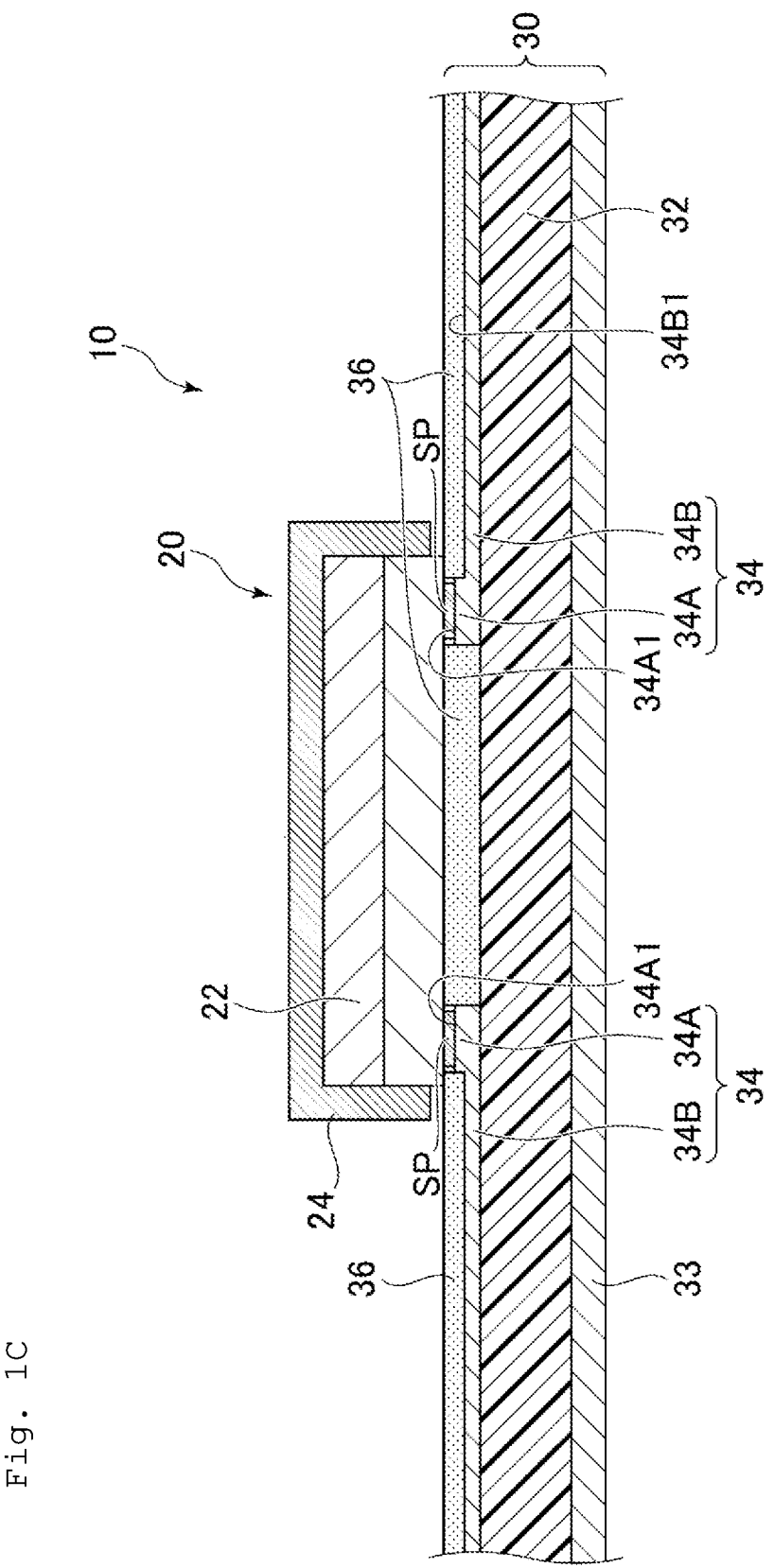

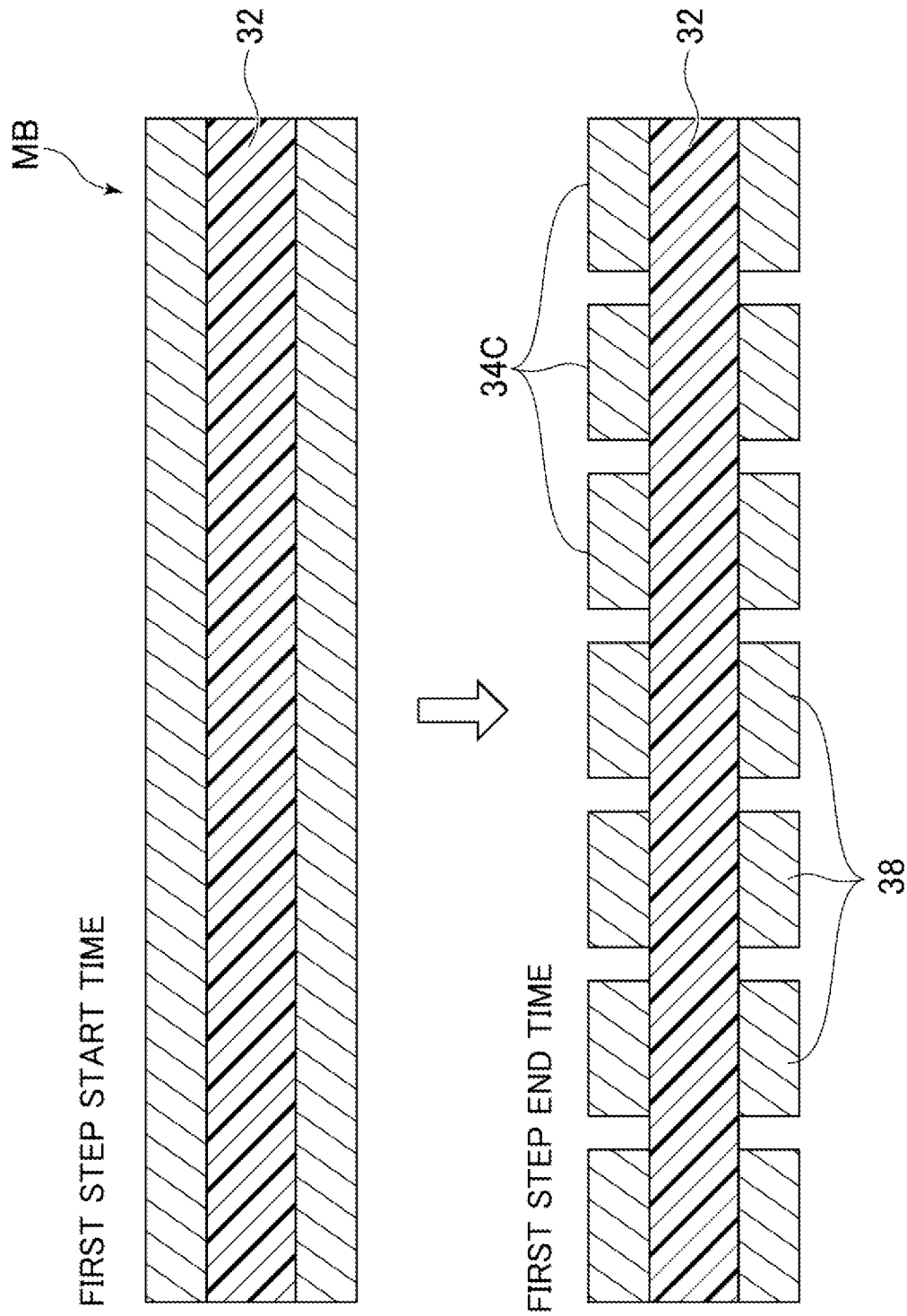

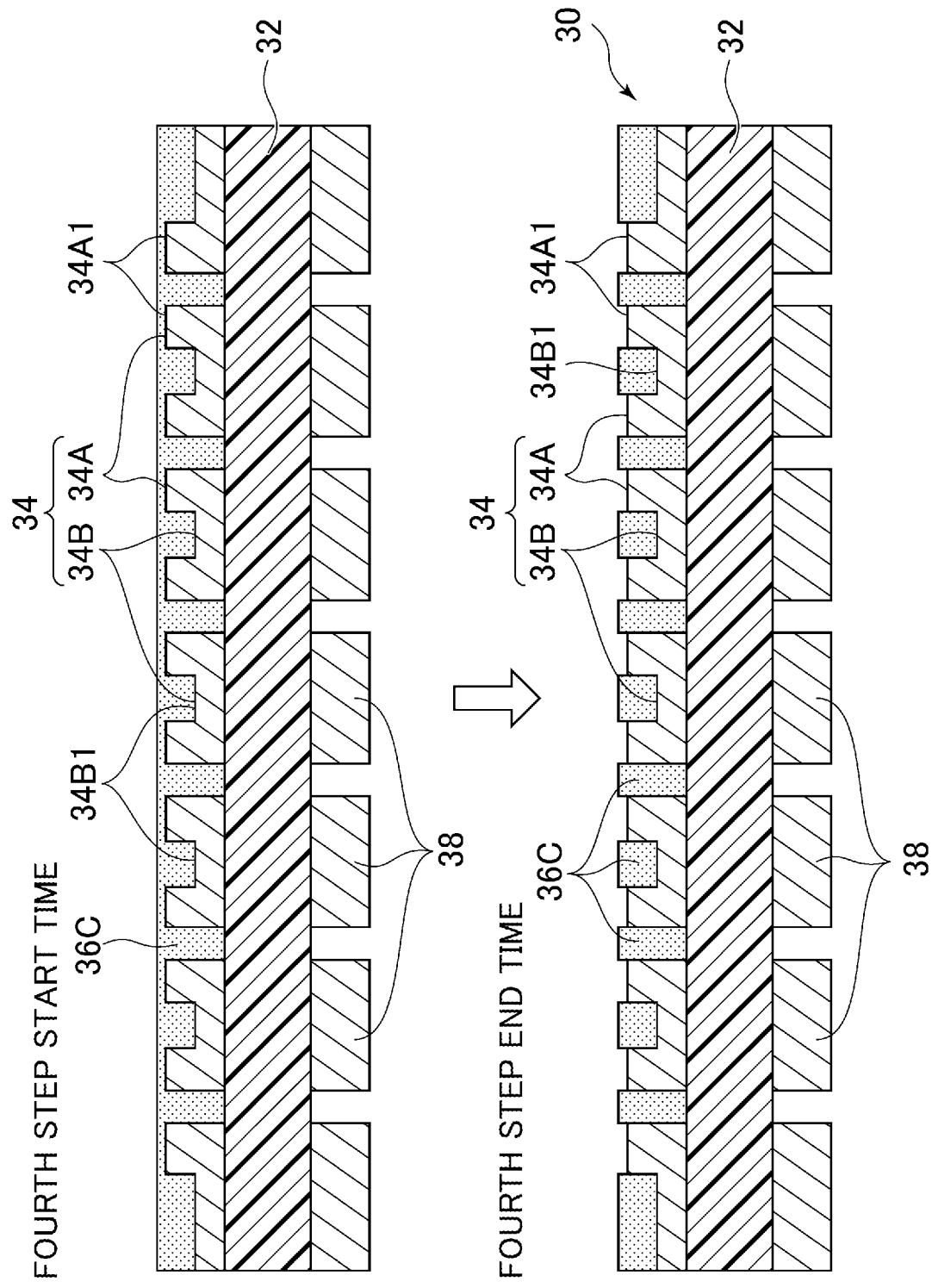

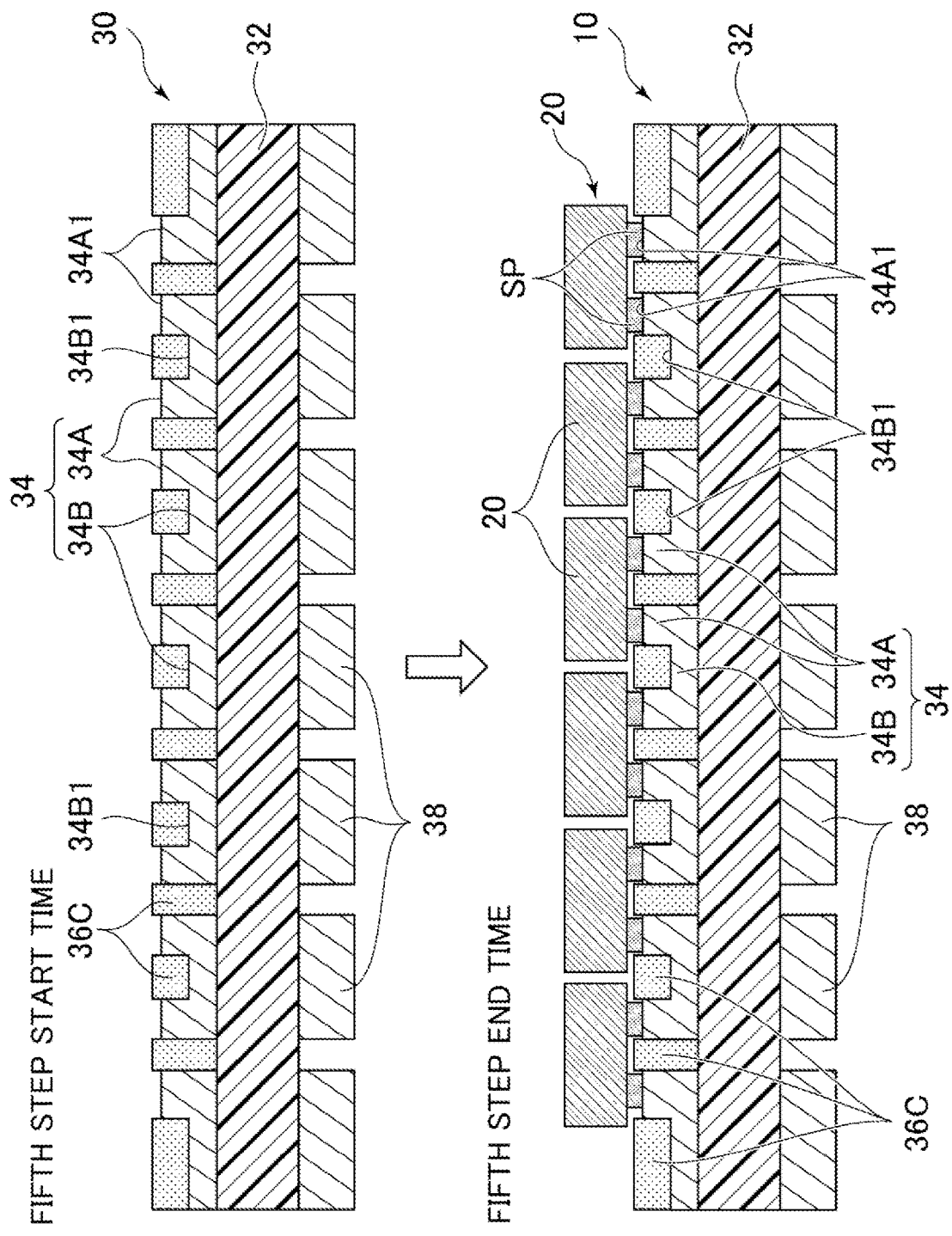

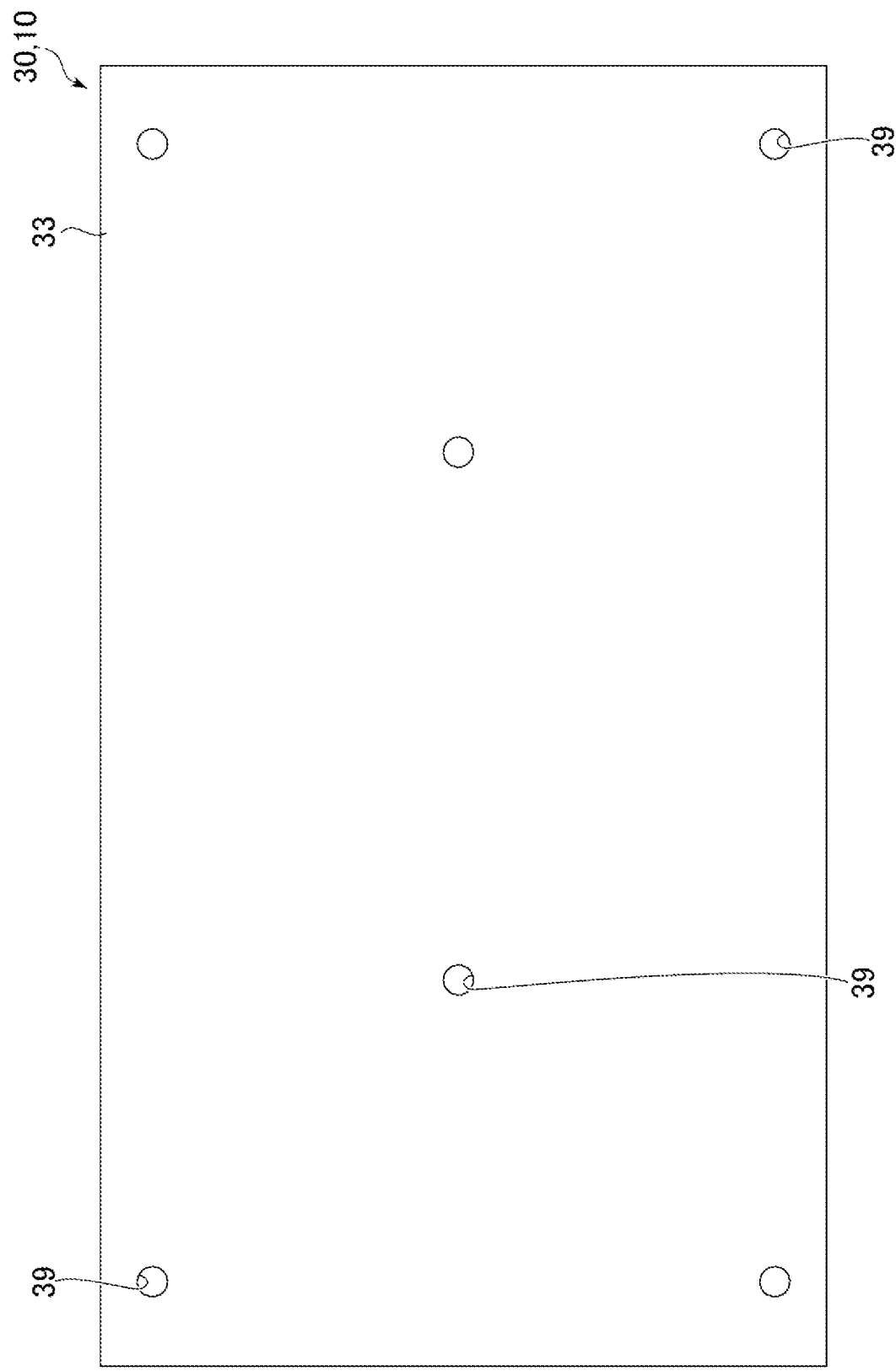

PHOSPHOR SUBSTRATE, LIGHT EMITTING SUBSTRATE, AND LIGHTING DEVICE

TECHNICAL FIELD

The present invention relates to a phosphor substrate, a light emitting substrate, and a lighting device.

BACKGROUND ART

Patent Document 1 discloses an LED lighting equipment including a substrate on which a light emitting element (LED element) is mounted. In this LED lighting equipment, a reflective material is provided on a surface of the substrate to improve light emitting efficiency.

RELATED DOCUMENT

Patent Document

[Patent Document 1] Chinese Patent Publication No. 106163113

SUMMARY OF THE INVENTION

Technical Problem

The LED lighting device disclosed in Patent Document 1 cannot adjust light emitted by the LED lighting equipment by the reflective material to light having a light emission color different from the light emitted by the light emitting element. In addition, Patent Document 1 does not clearly disclose a specific configuration of the substrate.

An object of the present invention is to provide a phosphor substrate, on one surface of which a phosphor layer is provided and a plurality of light emitting elements are mounted, the phosphor substrate hardly warps.

Solution to Problem

A phosphor substrate according to a first aspect of the present invention is a phosphor substrate having a plurality of light emitting elements mounted on one surface, and includes an insulating substrate, a first electrode group which is disposed on one surface of the insulating substrate and includes a plurality of electrodes bonded to the plurality of light emitting elements, and a phosphor layer which is disposed on one surface of the insulating substrate and includes a phosphor in which a light emission peak wavelength, in a case where light emitted by the light emitting element is used as excitation light, is in a visible light region, and the insulating substrate contains a bismaleimide resin and glass cloth.

The phosphor substrate according to a second aspect of the present invention according to the phosphor substrate according to the first aspect further includes a second electrode group which is disposed on the other surface of the insulating substrate and includes a plurality of electrodes.

In the phosphor substrate according to a third aspect of the present invention according to the phosphor substrate according to the first or second aspect, each of coefficients of thermal expansion in a vertical direction and a horizontal direction of the insulating substrate is equal to or less than 10 ppm/° C. in a range equal to or higher than 50° C. and equal to or lower than 100° C.

In the phosphor substrate according to a fourth aspect of the present invention according to the phosphor substrate according to anyone of the first to third aspects, a glass transition temperature of the insulating substrate is higher than 300° C.

In the phosphor substrate according to a fifth aspect of the present invention according to the phosphor substrate according to any one of the first to fourth aspects, a storage elastic modulus of the insulating substrate is more than $1.0 \times 10^{10}$ Pa and less than $1.0 \times 10^{11}$ Pa in a range equal to or higher than 100° C. and equal to or lower than 300° C.

In the phosphor substrate according to a sixth aspect of the present invention according to the phosphor substrate of any one of the first to fifth aspects, the plurality of electrodes included in the second electrode group are dummy electrodes electrically not connected to the plurality of electrodes included in the first electrode group.

In the phosphor substrate according to a seventh aspect of the present invention according to the phosphor substrate of any one of the first to sixth aspects, the second electrode group forms a pattern.

In the phosphor substrate according to an eighth aspect of the present invention according to the phosphor substrate according to anyone of the first to seventh aspects, a thickness of the insulating substrate is equal to or less than 200 μm.

In the phosphor substrate according to a ninth aspect of the present invention according to the phosphor substrate according to the eighth aspect, the thickness of the insulating substrate is equal to or more than 100 μm.

In the phosphor substrate according to a tenth aspect of the present invention according to the phosphor substrate according to any one of the first to ninth aspects, the light emitting element is formed as a chip sized package (CSP) in which an LED is incorporated.

A light emitting substrate of the present invention includes the phosphor substrate according to any one aspect of the first to tenth aspects, and a plurality of light emitting elements respectively bonded to the plurality of electrodes of the first electrode group.

A lighting device of the present invention includes the light emitting substrate, and a power source which supplies electric power for causing the light emitting element to emit light.

Advantageous Effects of Invention

According to the phosphor substrate according to the first to tenth aspects of the present invention, in the phosphor substrate having the phosphor layer provided and a plurality of light emitting elements mounted on one surface thereof, it is possible to suppress occurrence of warpage caused by heat generation of the plurality of light emitting elements.

In addition, in the light emitting substrate of the present invention, it is possible to stabilize light emission from the plurality of light emitting elements and the phosphor layer along with the suppression of the occurrence of warpage of the phosphor substrate.

BRIEF DESCRIPTION OF THE DRAWINGS

The objects described above, other objects, features and advantages will be further clarified by the preferred embodiments which will be described later and the accompanying drawings below.

FIG. 1C is a partial cross-sectional view of the light emitting substrate taken along a cutting line 1C-1C of FIG. 1A.

FIG. 3A is an explanatory diagram of a first step in a method for manufacturing the light emitting substrate of the present embodiment.

FIG. 3D is an explanatory diagram of a fourth step in the method for manufacturing the light emitting substrate according to the present embodiment.

FIG. 3E is an explanatory diagram of a fifth step in the method for manufacturing the light emitting substrate according to the present embodiment.

FIG. 8 is a bottom view of a light emitting substrate and a phosphor substrate of a modification example.

DESCRIPTION OF EMBODIMENTS

Overview

Figure 1A:
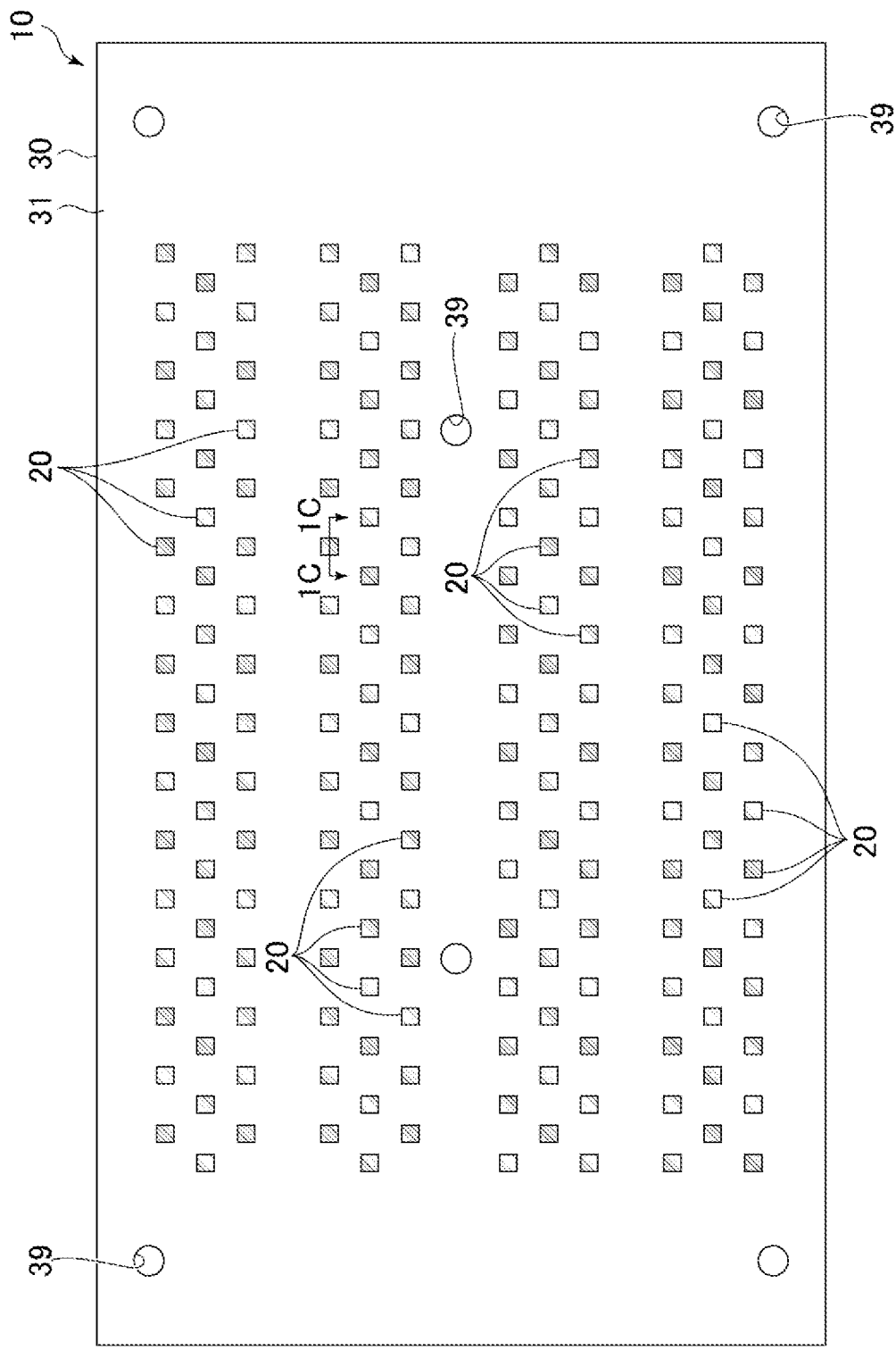
FIG. 1A is a plan view of a light emitting substrate of the present embodiment.

Hereinafter, a configuration and function of a light emitting substrate 10 of the present embodiment will be described with reference to FIGS. 1A to 1C, 2A, and 2B. Then, a method for manufacturing the light emitting substrate 10 of the present embodiment will be described with reference to FIGS. 3A to 3E. Next, a light emitting operation of the light emitting substrate 10 of the present embodiment will be described with reference to FIG. 4. After that, effects of the present embodiment will be described with reference to FIGS. 4 to 7 and the like. In all the drawings referred to in the following description, the same reference numerals are used for the same constituent elements and the description thereof will not be repeated.

Configuration and Function of Light Emitting Substrate of Present Embodiment

Figure 1B:
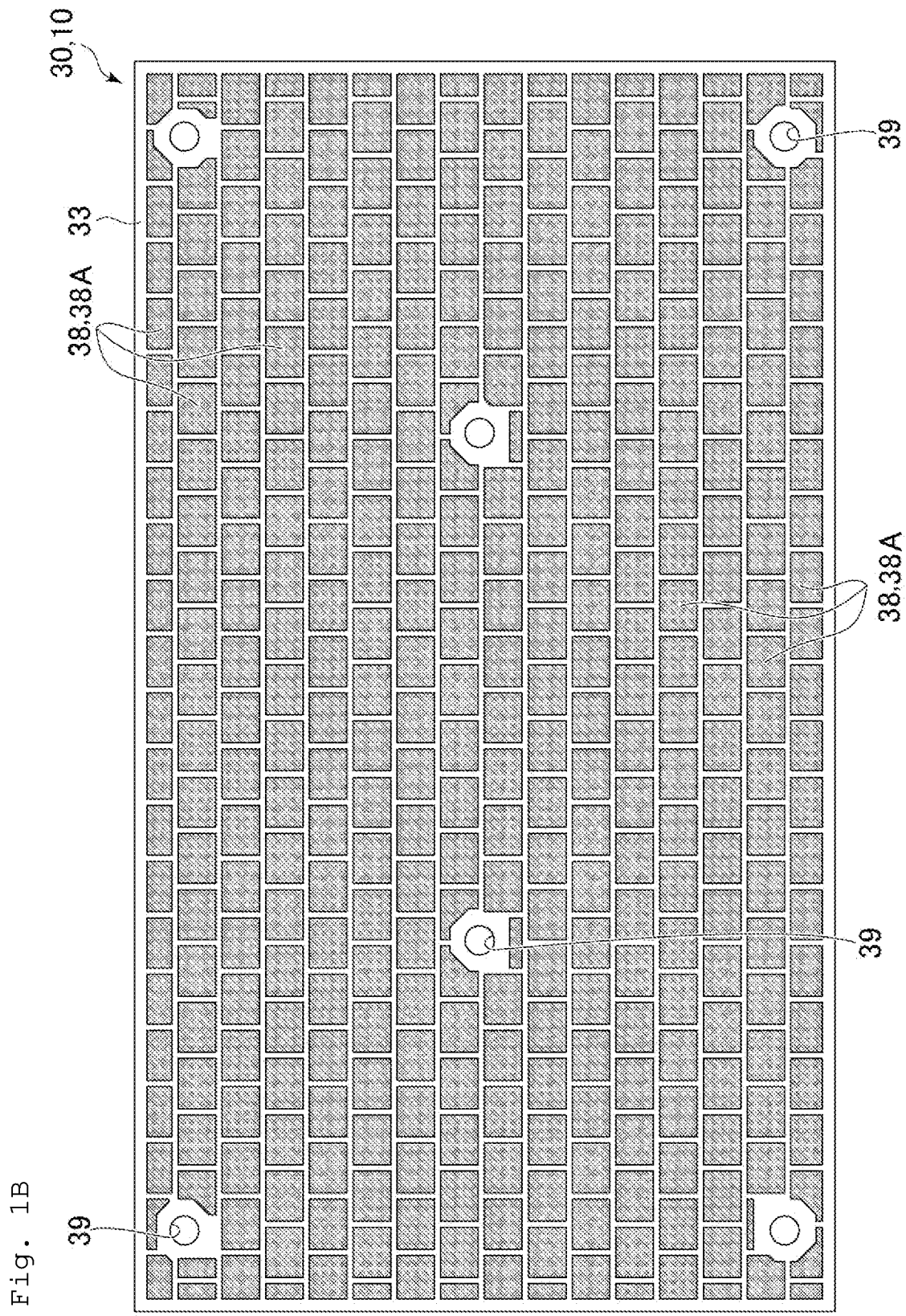
FIG. 1B is a bottom view of a light emitting substrate and a phosphor substrate of the present embodiment.

FIG. 1A is a plan view of the light emitting substrate 10 of the present embodiment (view seen from a front surface 31), and FIG. 1B is a bottom view of the light emitting substrate 10 of the present embodiment (view seen from a rear surface 33). FIG. 1C is a partial cross-sectional view of the light emitting substrate 10 taken along a cutting line 1C-1C of FIG. 1A.

The light emitting substrate 10 of the present embodiment is rectangular as an example, when seen from the front surface 31 and the rear surface 33. In addition, the light emitting substrate 10 of the present embodiment includes a plurality of light emitting elements 20, a phosphor substrate 30, and electronic components (not shown) such as a connector, a driver IC, and the like. That is, in the light emitting substrate 10 of the present embodiment, the plurality of light emitting elements 20 and the electronic components are mounted on the phosphor substrate 30.

The light emitting substrate 10 of the present embodiment has a function of emitting light, in a case where power is supplied from an external power source (not shown) by directly attaching a lead wire or through a connector. Accordingly, the light emitting substrate 10 of the present embodiment is used as a main optical component in, for example, a lighting device (not shown).

Plurality of Light Emitting Elements

As an example, each of the plurality of light emitting elements 20 is formed as a Chip Scale Package (CSP) in which a flip chip LED 22 (hereinafter, referred to as an LED 22) is incorporated (see FIG. 1C). As the CSP, as shown in FIG. 1C, it is preferable that the entire circumference (five surfaces) except a bottom surface of the LED 22 is covered with a phosphor sealing layer 24. The phosphor sealing layer 24 contains a phosphor, and light of the LED 22 is color-converted by the phosphor of the phosphor sealing layer 24 and emitted to the outside. As shown in FIG. 1A, the plurality of light emitting elements 20 are mounted on the phosphor substrate 30 in a state of being regularly arranged on the front surface 31 (an example of one surface) of the phosphor substrate 30 over the entire front surface 31. A correlated color temperature of the light emitted by each light emitting element 20 of the present embodiment is set to 3,018K as an example. In addition, the plurality of light emitting elements 20 use a heat sink (not shown) and a cooling fan (not shown) during the light emitting operation to dissipate heat (cool) the phosphor substrate 30 to be, for example, room temperature to 50° C. to 100° C. Here, to supplement the meaning of "to" used in the numerical range in the present specification, for example, "50° C. to 100° C." means "equal to or higher than 50° C. and equal to or lower than 100° C.". In addition, "to" used in the numerical range in this specification means "equal to or more than the description part before "to" and equal to or less than the description part after "to".

Phosphor Substrate

Figure 2A:
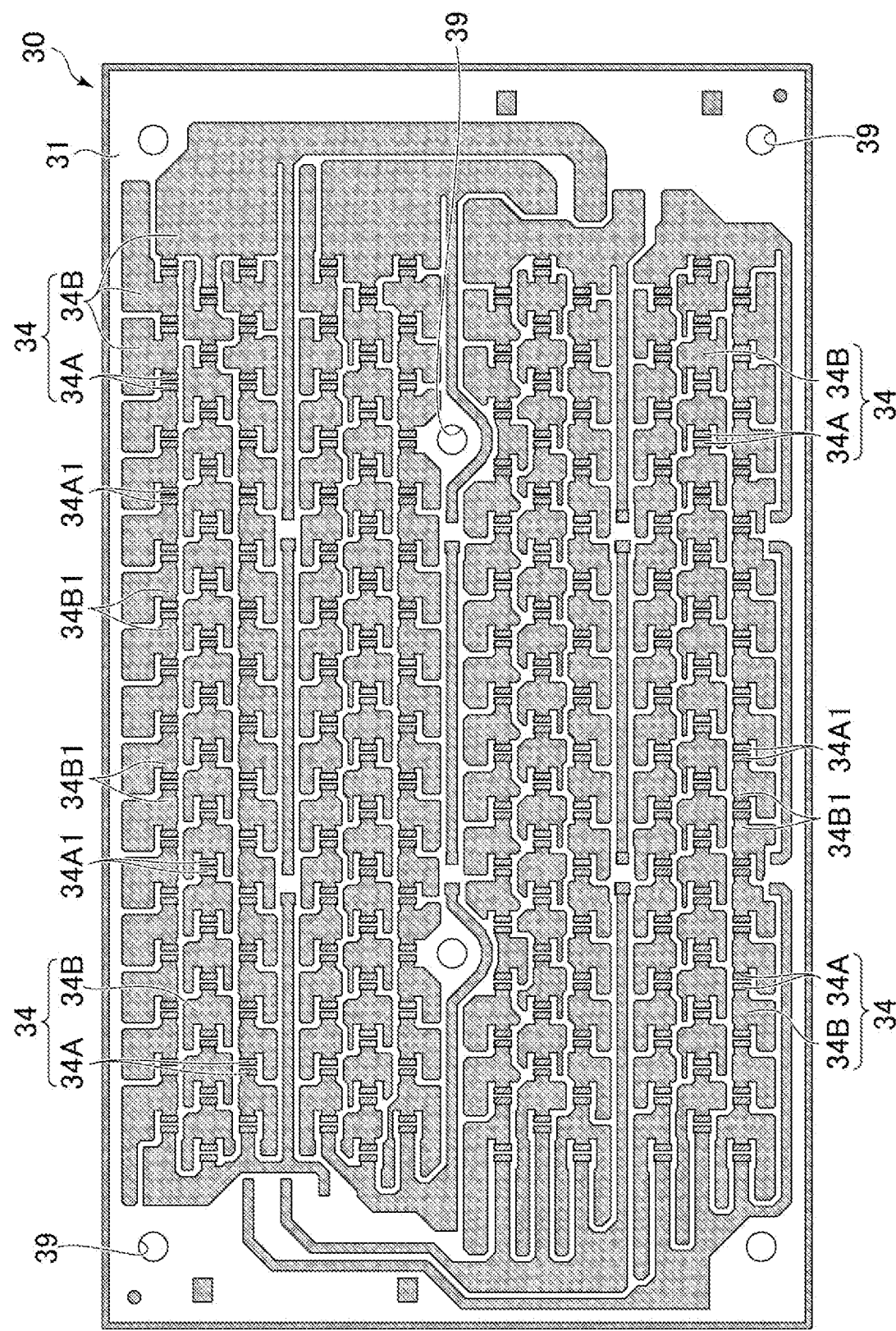
FIG. 2A is a plan view of a phosphor substrate of the present embodiment (the phosphor layer is not shown).
Figure 2B:
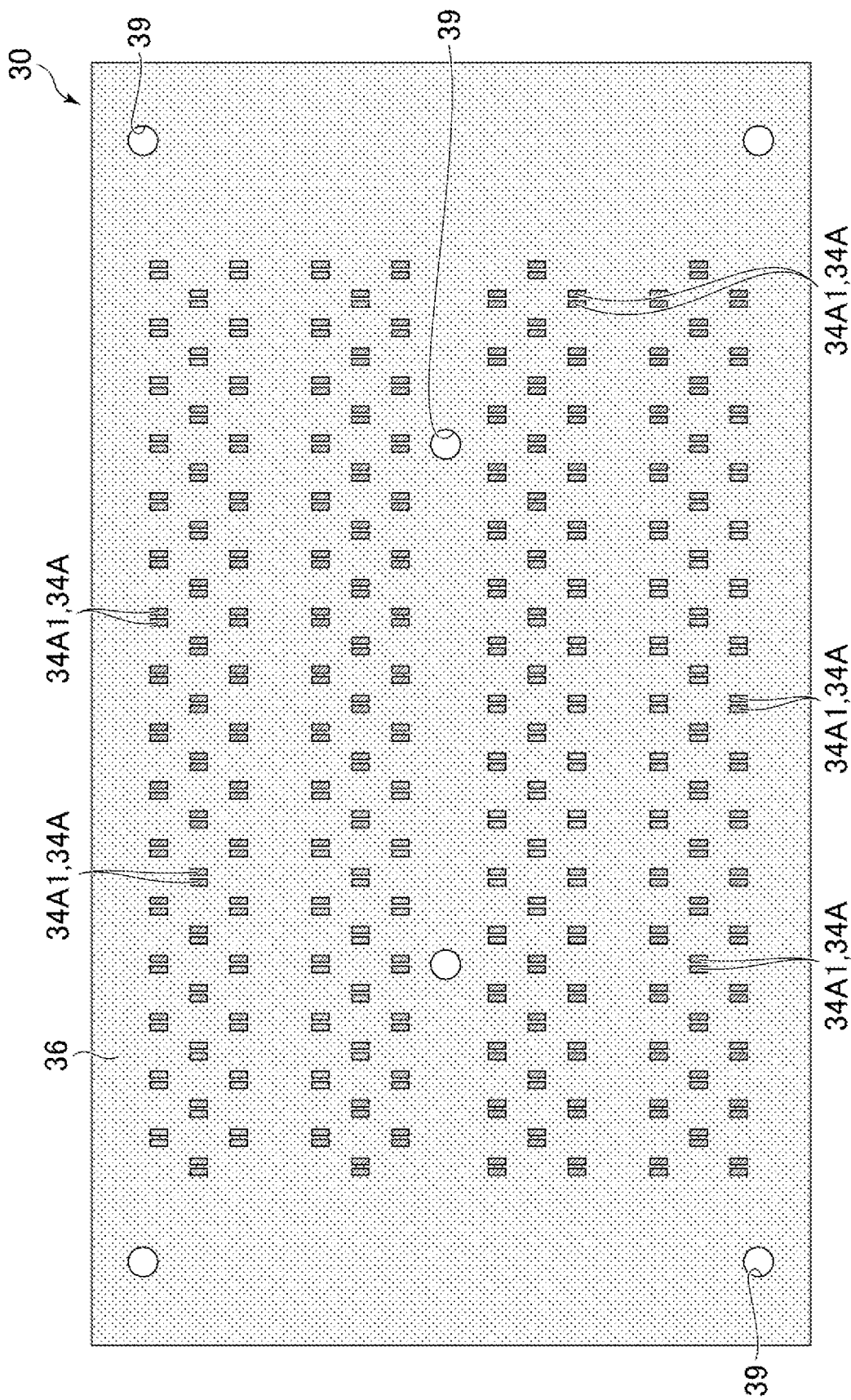
FIG. 2B is a plan view of the phosphor substrate of the present embodiment.

FIG. 2A is a view of the phosphor substrate 30 of the present embodiment and is a plan view (seen from the front surface 31) in which the phosphor layer 36 omitted. FIG. 2B is a plan view (seen from the front surface 31) of the phosphor substrate 30 of the present embodiment. The bottom view of the phosphor substrate 30 of the present embodiment is the same as the view of the light emitting substrate 10 seen from the rear surface 33. In addition, the partial cross-sectional view of the phosphor substrate 30 of the present embodiment is the same as the view when the light emitting element 20 is removed from the partial cross-sectional view of FIG. 1C. That is, the phosphor substrate 30 of the present embodiment is rectangular as an example, when seen from the front surface 31 and the rear surface 33.

The phosphor substrate 30 of the present embodiment includes an insulating layer 32 (an example of an insulating substrate), an electrode layer 34 (an example of a first electrode group), a phosphor layer 36, and a rear surface pattern layer 38 (an example of a second electrode group) (see FIGS. 1B, 1C, and 2A, and 2B). Although the phosphor layer 36 is not shown in FIG. 2A, the phosphor layer 36 is, for example, disposed on a portion of the front surface 31 of the insulating layer 32 and the electrode layer 34, other than a plurality of electrode pairs 34A (an example of a plurality of electrodes) which will be described later, as shown in FIG. 2B.

In addition, as shown in FIGS. 1B and 2A, the phosphor substrate 30 is formed with six through holes 39 at four portions near the four corners and two portions near the center. The six through holes 39 are used as positioning holes during the manufacturing of the phosphor substrate 30 and the light emitting substrate 10. In addition, the six through holes 39 are used as mounting screw holes for ensuring a heat-drawing effect (preventing warping and floating of the substrate) of a (light emitting) lamp housing. As will be described later, the phosphor substrate 30 of the present embodiment is manufactured by processing (etching or the like) a double-sided plate (hereinafter, referred to as a motherboard MB. see FIG. 3A) in which copper foil layers are provided on both sides of an insulating plate, and CS-3305A manufactured by Risho Kogyo Co., Ltd. is used as an example of the motherboard MB.

Insulating Layer

Hereinafter, main features of the insulating layer 32 of the present embodiment will be described.

As described above, a shape thereof is, for example, rectangular when seen from the front surface 31 and the rear surface 33.

A material thereof is, for example, an insulating material containing a bismaleimide resin and a glass cloth. In addition, the insulating material does not contain halogen and phosphorus (halogen-free, phosphorus-free).

A thickness thereof is preferably, for example, 100 μm to 200 μm.

Coefficients of thermal expansion (CTE) thereof in a vertical direction and a horizontal direction are, for example, equal to or less than 10 ppm/° C. in a range of 50° C. to 100° C., respectively. From another point of view, each of the coefficients of thermal expansion (CTE) in the vertical direction and the horizontal direction is, for example, 6 ppm/K. This value is substantially the same as that of the light emitting element 20 of the present embodiment (90% to 110%, that is, within ±10%).

A glass transition temperature thereof is, for example, higher than 300° C.

A storage elastic modulus is, for example, more than $1.0 \times 10^{10}$ Pa and less than $1.0 \times 10^{11}$ Pa in a range of 100° C. to 300° C.

A bending elastic modulus in the vertical direction and the horizontal direction is, for example, 35 GPa and 34 GPa in a normal state, respectively.

A hot bending elastic modulus in the vertical direction and the horizontal directions is, for example, 19 GPa at 250° C.

A water absorption rate is, for example, 0.13%, in a case where the insulating layer is left for 24 hours in a temperature environment of 23° C.

A relative permittivity is, for example, 4.6 under a normal state of 1 MHz.

A dielectric loss tangent is, for example, 0.010 under a normal state of 1 MHz.

The insulating layer 32 of the present embodiment corresponds to a portion of the insulating layer portion of the motherboard MB, and CS-3305A manufactured by Risho Kogyo Co., Ltd. is used as an example of the motherboard MB.

Electrode Layer

The electrode layer 34 of the present embodiment is a metal layer provided on the front surface 31 side of the insulating layer 32. The electrode layer 34 of this embodiment is, for example, a copper foil layer (a layer formed of Cu). In other words, the electrode layer 34 of the present embodiment is formed so that at least the surface thereof contains copper.

The electrode layer 34 has a pattern provided on the insulating layer 32, and is electrically connected to a terminal (not shown) to which a connector (not shown) is bonded. The electrode layer 34 supplies electric power supplied from an external power source (not shown) through the connector to the plurality of light emitting elements 20 at the time of configuring the light emitting substrate 10. Accordingly, a part of the electrode layer 34 is the plurality of electrode pairs 34A to which the plurality of light emitting elements 20 are bonded. That is, the electrode layer 34 of the light emitting substrate 10 of the present embodiment is disposed on the insulating layer 32 and connected to each light emitting element 20.

In addition, as described above, since the plurality of light emitting elements 20 of the light emitting substrate 10 of the present embodiment are regularly arranged over the entire front surface 31, the plurality of electrode pairs 34A are also arranged over the entire front surface 31 (see FIG. 2A). A portion of the electrode layer 34 other than the plurality of electrode pairs 34A is referred to as a wiring portion 34B. In the present embodiment, as shown in FIG. 1C, as an example, the plurality of electrode pairs 34A protrude outward from the wiring portion 34B in a thickness direction of the insulating layer 32 (phosphor substrate 30). In other words, on the surface of the electrode layer 34 facing the outer side in the thickness direction of the insulating layer 32, the surface to which each light emitting element 20 is bonded (bonded surface 34A1) is positioned on the outer side in the thickness direction of the insulating layer 32, compared to the surface other than the bonded surface 34A1 (non-bonded surface 34B1).

A region of the front surface 31 of the insulating layer 32 where the electrode layer 34 is disposed (defined as first arrangement region) is, for example, a region (area) that is equal to or more than 60% of the front surface 31 of the insulating layer 32 (see FIG. 2A). In addition, a region that is equal to or more than 80% of the first arrangement region overlaps with a region (defined as the second arrangement region) of the insulating layer 32 in which the rear surface pattern layer 38 is disposed, in the thickness direction of the insulating layer 32.

Phosphor Layer

As shown in FIG. 2B, the phosphor layer 36 of the present embodiment is, for example, disposed on a portion of the front surface 31 of the insulating layer 32 and the electrode layer 34, other than the plurality of electrode pairs 34A. That is, the phosphor layer 36 is disposed in a region of the electrode layer 34 other than the plurality of electrode pairs 34A. From another point of view, at least a part of the phosphor layer 36 is disposed so as to surround each bonded surface 34A1 over the entire circumference, when seen from the surface 31 side (see FIGS. 1C and 2B). In the present embodiment, the region of the front surface 31 of the insulating layer 32 where the phosphor layer 36 is disposed is, for example, a region that is equal to or more than 80% of the front surface 31 of the insulating layer 32.

The surface of the phosphor layer 36 on the outer side in the thickness direction of the insulating layer 32 is positioned on the outer side in the thickness direction, compared to the bonded surface 34A1 of the electrode layer 34 (see FIG. 1C).

The phosphor layer 36 of the present embodiment is, for example, an insulating layer containing a phosphor and a binder, which will be described later. The phosphor contained in the phosphor layer 36 is fine particles held in a state of being dispersed in a binder, and has a property of exciting the light emitted from the LED 22 of each light emitting element 20 as excitation light. Specifically, the phosphor of the present embodiment has a property that the light emission peak wavelength when the light emitted by the light emitting element 20 is used as excitation light is in a visible light region. The binder may be, for example, an epoxy-based binder, an acrylate-based binder, or a silicone-based binder, and may have an insulating property equivalent to that of the binder contained in a solder resist.

Specific Example of Phosphor

Here, the phosphor contained in the phosphor layer 36 of the present embodiment is, for example, at least one or more phosphors selected from the group consisting of an α-type sialon phosphor containing Eu, a β-type sialon phosphor containing Eu, a CASN phosphor containing Eu, and a SCASN phosphor containing Eu. The phosphor described above is an example of the present embodiment, and may be a phosphor other than the phosphor described above, such as YAG, LuAG, BOS, and other visible light-excited phosphors.

The α-type sialon phosphor containing Eu is represented by general formula: $M_xEu_ySi_{12-(m+n)}Al_{(m+n)}O_nN_{16-n}$. In the above general formula, M is at least one or more elements containing at least Ca selected from the group consisting of Li, Mg, Ca, Y, and lanthanide elements (here, excluding La and Ce), and in a case where a valence of M is a, $ax+2y=m$, x satisfies $0<x\leq1.5$, $0.3\leq m<4.5$, and $0<n<2.25$.

The β-type sialon phosphor containing Eu is a phosphor in which divalent europium ($Eu^{2+}$) is dissolved as a light emitting center in β-type sialon represented by general formula: $Si_{6-z}Al_zO_zN_{8-z}$ ($z=0.005$ to 1).

In addition, examples of a nitride phosphor include a CASN phosphor containing Eu, a SCASN phosphor containing Eu, and the like.

The CASN phosphor containing Eu (an example of a nitride phosphor) is, for example, a red phosphor which is represented by the formula $CaAlSiN_3:Eu^{2+}$ in which $Eu^{2+}$ is used as an activator and a crystal formed of alkaline earth silicate is used as a base. In the definition of the CASN phosphor containing Eu in the present specification, the SCASN phosphor containing Eu is excluded.

The SCASN phosphor containing Eu (an example of a nitride phosphor) is, for example, a red phosphor which is represented by the formula $(Sr,Ca)AlSiN_3:Eu^{2+}$ in which $Eu^{2+}$ is used as an activator and a crystal formed of alkaline earth silicate is used as a base.

Rear Surface Pattern Layer

The rear surface pattern layer 38 of the present embodiment is a metal layer provided on the rear surface 33 side of the insulating layer 32. The rear surface pattern layer 38 of this embodiment is, for example, a copper foil layer (a layer formed of Cu).

As shown in FIG. 1B, the rear surface pattern layer 38 is a layer in which a plurality of rectangular blocks 38A (an example of a plurality of electrodes, hereinafter, also referred to as a plurality of portions 38A) arranged linearly along a longitudinal direction of the insulating layer 32 are arranged to be adjacent to each other by shifting phase in a short direction. That is, the rear surface pattern layer 38 of the present embodiment forms a pattern in which the plurality of portions 38A are arranged.

The rear surface pattern layer 38 is, for example, an independent floating layer. That is, the rear surface pattern layer 38 (configured with the plurality of portions 38A) of the present embodiment is dummy electrodes which are not electrically connected to the plurality of electrode pairs 34A included in the electrode layer 34 on the surface 31 side. In addition, the area of the second arrangement region of the present embodiment is set to be larger than the area of the first arrangement region (see FIGS. 1B and 2A), but it is set as the area which is 90% to 110% of the area of the first arrangement region.

The above is the description of the configuration of the light emitting substrate 10 and the phosphor substrate 30 of the present embodiment.

Method for Manufacturing Light Emitting Substrate of Present Embodiment

Next, a method for manufacturing the light emitting substrate 10 of the present embodiment will be described with reference to FIGS. 3A to 3E. The method for manufacturing the light emitting substrate 10 of the present embodiment includes a first step, a second step, a third step, a fourth step, and a fifth step, and each step is performed in this order.

First Step

FIG. 3A is a diagram showing a start time and an end time of the first step. The first step is a step of forming a pattern 34C that is the same as the electrode layer 34, when seen from the thickness direction, on the front surface 31 of the motherboard MB, and the rear surface pattern layer 38 on the rear surface 33. This step is performed, for example, by etching using a mask pattern (not shown).

Second Step

Figure 3B:
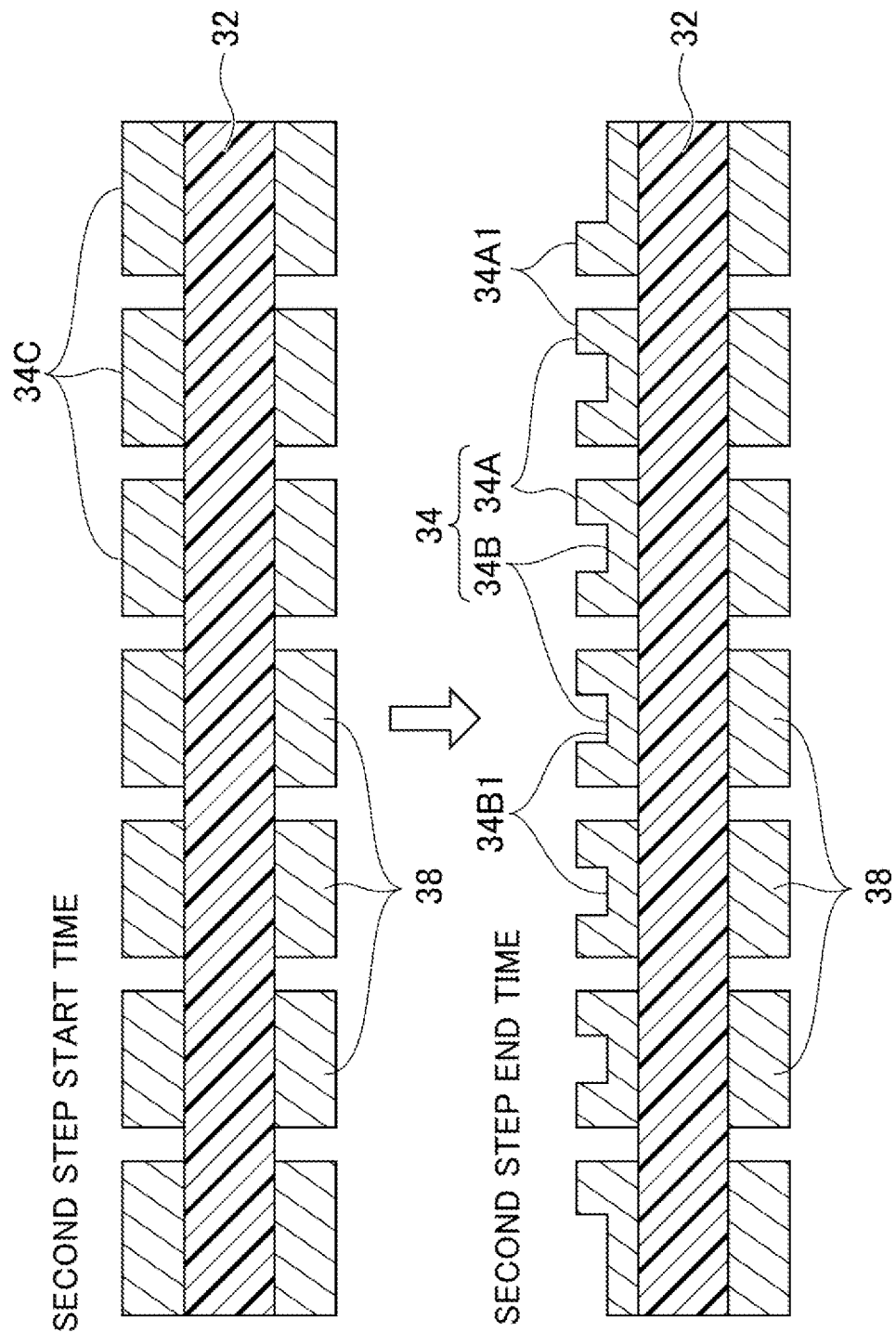
FIG. 3B is an explanatory diagram of a second step in the method for manufacturing the light emitting substrate of the present embodiment.

FIG. 3B is a diagram showing a start time and an end time of the second step. The second step is a step of half-etching (etching halfway in the thickness direction) of a part of the pattern 34C. In a case where this step ends, as a result, the electrode layer 34 including the plurality of electrode pairs 34A and the wiring portion 34B is formed. That is, in a case where this step ends, the plurality of bonded surfaces 34A1 and the plurality of non-bonded surfaces 34B1 are formed on the electrode layer 34. This step is performed, for example, by etching using a mask pattern (not shown).

Third Step

Figure 3C:
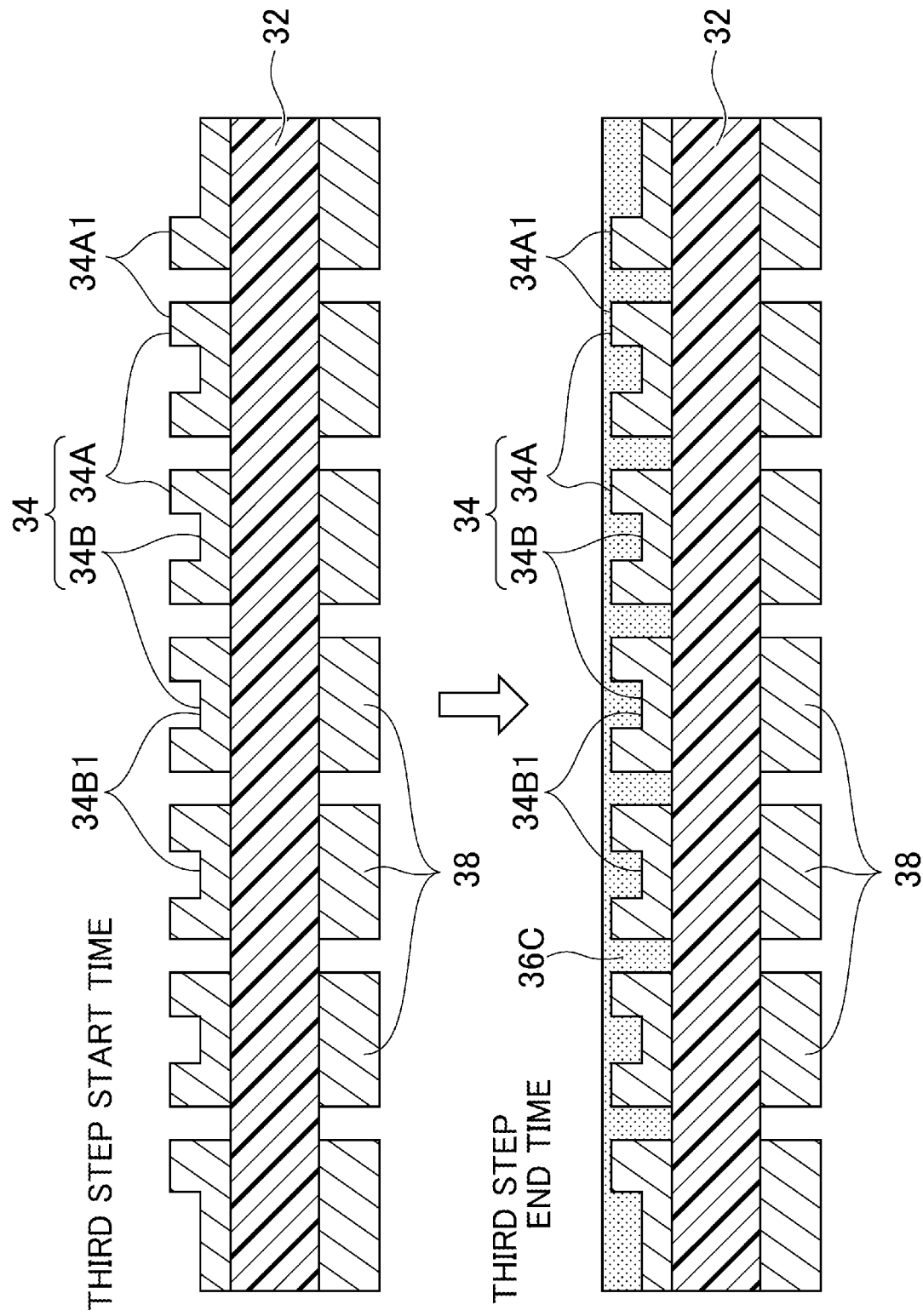
FIG. 3C is an explanatory diagram of a third step in the method for manufacturing the light emitting substrate of the present embodiment.

FIG. 3C is a diagram showing a start time and an end time of the third step. The third step is a step of applying a phosphor coating material 36C to the entire surface of the front surface 31 of the insulating layer 32, that is, the surface on which the electrode layer 34 is formed. In this step, for example, the phosphor coating material 36C is applied by printing. In this case, the phosphor coating material 36C is applied thicker than all of the electrode pairs 34A. In other words, in this case, the phosphor coating material 36C is applied in the thickness direction of the insulating layer 32 so as to cover each bonded surface 34A1 from the outer side in the thickness direction (so that each bonded surface 34A1 is concealed by the phosphor coating material 36C).

Fourth Step

FIG. 3D is a diagram showing a start time and an end time of the fourth step. The fourth step is a step of removing a part of the phosphor layer 36 obtained by curing the phosphor coating material 36C and exposing the bonded surface 34A1 of all of the electrode pairs 34A. Here, in a case where the binder of the phosphor coating material 36C is, for example, a thermosetting resin, the phosphor coating material 36C is cured by heating and then laser light is selectively emitted to a portion of the phosphor layer 36 on each bonded surface 34A1 by using a two-dimensional laser processing device (not shown). As a result, a portion of the phosphor layer 36 on each bonded surface 34A1 and a portion of the electrode pair 34A near each bonded surface 34A1 are ablated, and each bonded surface 34A1 is exposed. As a result of the above, the phosphor substrate 30 of the present embodiment is manufactured.

In addition to the above method, this step may be performed by, for example, the following method. In a case where the binder of the phosphor coating material 36C is, for example, a UV curable resin (photosensitive resin), a mask pattern is applied to a portion (coating material opening) overlapping each bonded surface 34A1 to expose UV light, the portion other than the mask pattern is UV-cured, and a non-exposed portion (uncured portion) is removed with a resin removing liquid to expose each bonded surface 34A1. After that, in general, after-curing is performed by applying heat (photo development method).

Fifth Step

FIG. 3E is a diagram showing a start time and an end time of the fifth step. The fifth step is a step of mounting a plurality of light emitting elements 20 on the phosphor substrate 30. In this step, a solder paste SP is printed on each bonded surface 34A1 of the plurality of electrode pairs 34A of the phosphor substrate 30, and the solder paste SP is melted in an environment of 250° C. as an example, in a state where each electrode of the plurality of light emitting elements 20 is positioned on each bonded surface 34A1. After that, in a case where the solder paste SP is cooled and solidified, each light emitting element 20 is bonded to each electrode pair 34A. That is, this step is performed by, for example, a reflow step.

The above is the description of the method for manufacturing the light emitting substrate 10 of the present embodiment.

Light Emitting Operation of Light Emitting Substrate of Present Embodiment

Figure 4:
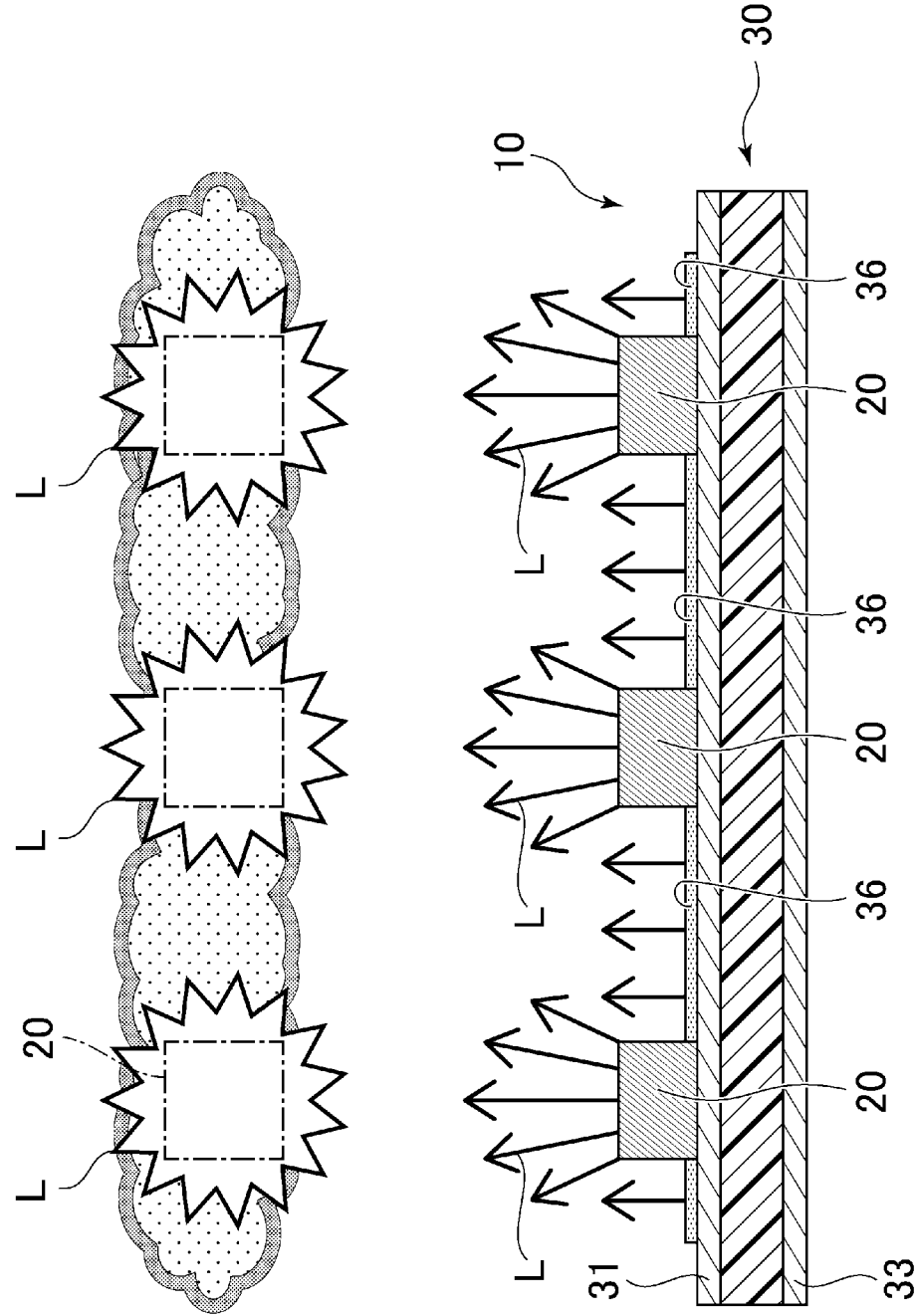
FIG. 4 is a diagram for explaining a light emitting operation of the light emitting substrate of the present embodiment.

Next, the light emitting operation of the light emitting substrate 10 of the present embodiment will be described with reference to FIG. 4. FIG. 4 is a diagram for explaining the light emitting operation of the light emitting substrate 10 of the present embodiment.

First, in a case where an operation switch (not shown) for operating the plurality of light emitting elements 20 is turned on, the power supply is started from the external power source (not shown) to the electrode layer 34 through the connector (not shown), the plurality of light emitting elements 20 emit light L radially, and some light L reaches the front surface 31 of the phosphor substrate 30. Hereinafter, the behavior of the light L will be described separately according to a traveling direction of the emitted light L.

Some light L emitted from each light emitting element 20 is emitted to the outside without being incident to the phosphor layer 36. In this case, a wavelength of the light L remains as the same as the wavelength of the light L, in a case of being emitted from each light emitting element 20.

In addition, the light of the LED 22 itself in some light L emitted from each light emitting element 20 is incident to the phosphor layer 36. Here, the "light of the LED 22 itself in some light L" described above is light of the emitted light L that is not color-converted by the phosphor (phosphor sealing layer 24) of each light emitting element 20 (CSP itself), that is, light of the LED 22 itself (for example, blue (wavelength is approximately 470 nm) color). Then, in a case where the light L of the LED 22 itself collides with the phosphor dispersed in the phosphor layer 36, the phosphor excites and emits excitation light. Here, the reason why the phosphor is excited is that the phosphor dispersed in the phosphor layer 36 uses a phosphor (visible light excited phosphor) having an excitation peak in blue light. Along with this, a part of the energy of the light L is used for exciting the phosphor, so that the light L loses a part of the energy. As a result, the wavelength of the light L is converted (wavelength conversion is performed). For example, depending on the type of phosphor in the phosphor layer 36 (for example, in a case where a red CASN is used as the phosphor), the wavelength of light L becomes longer (for example, 650 nm or the like). In addition, the excitation light in the phosphor layer 36 may be emitted from the phosphor layer 36 as it is, but some of the excitation light goes to the lower electrode layer 34. Then, some of the excitation light is emitted to the outside by reflection on the electrode layer 34. As described above, in a case where the wavelength of the excitation light by the phosphor of the phosphor layer 36 is equal to or more than 600 nm, the reflection effect can be expected, even if the electrode layer 34 is formed of Cu. The wavelength of the light L differs from the above example depending on the type of the phosphor in the phosphor layer 36, but in any case, the wavelength conversion of the light L is performed. For example, in a case where the wavelength of the excitation light is less than 600 nm, a reflection effect can be expected, if the electrode layer 34 or its surface is formed of, for example, Ag (plating). In addition, a white reflective layer may be provided on the lower side (insulating layer 32 side) of the phosphor layer 36. The reflective layer is provided with, for example, a white coating material such as a titanium oxide filler.

As described above, the light L emitted by each light emitting element 20 (the light L emitted radially by each light emitting element 20) is irradiated to the outside together with the excitation light through a plurality of optical paths as described above. Therefore, in a case where a light emission wavelength of the phosphor contained in the phosphor layer 36 and a light emission wavelength of the phosphor (phosphor sealing layer 24) that seals (or covers) the LED 22 of the light emitting element 20 (CSP) are different from each other, the light emitting substrate 10 of the present embodiment emits a bundle of the light L, in a case of being emitted by each light emitting element 20, by setting it as a bundle of the light L containing the light L at a wavelength different from the wavelength of the light L, in a case of being emitted by each light emitting element 20, together with the excitation light. For example, the light emitting substrate 10 of the present embodiment emits combined light of light (wavelength) emitted by the light emitting element 20 and light (wavelength) emitted from the phosphor layer 36.

The above is the description of the light emitting operation of the light emitting substrate 10 of the present embodiment.

Effect of Present Embodiment

Next, the effect of the present embodiment will be described with reference to the drawings.

First Effect

Figure 5:
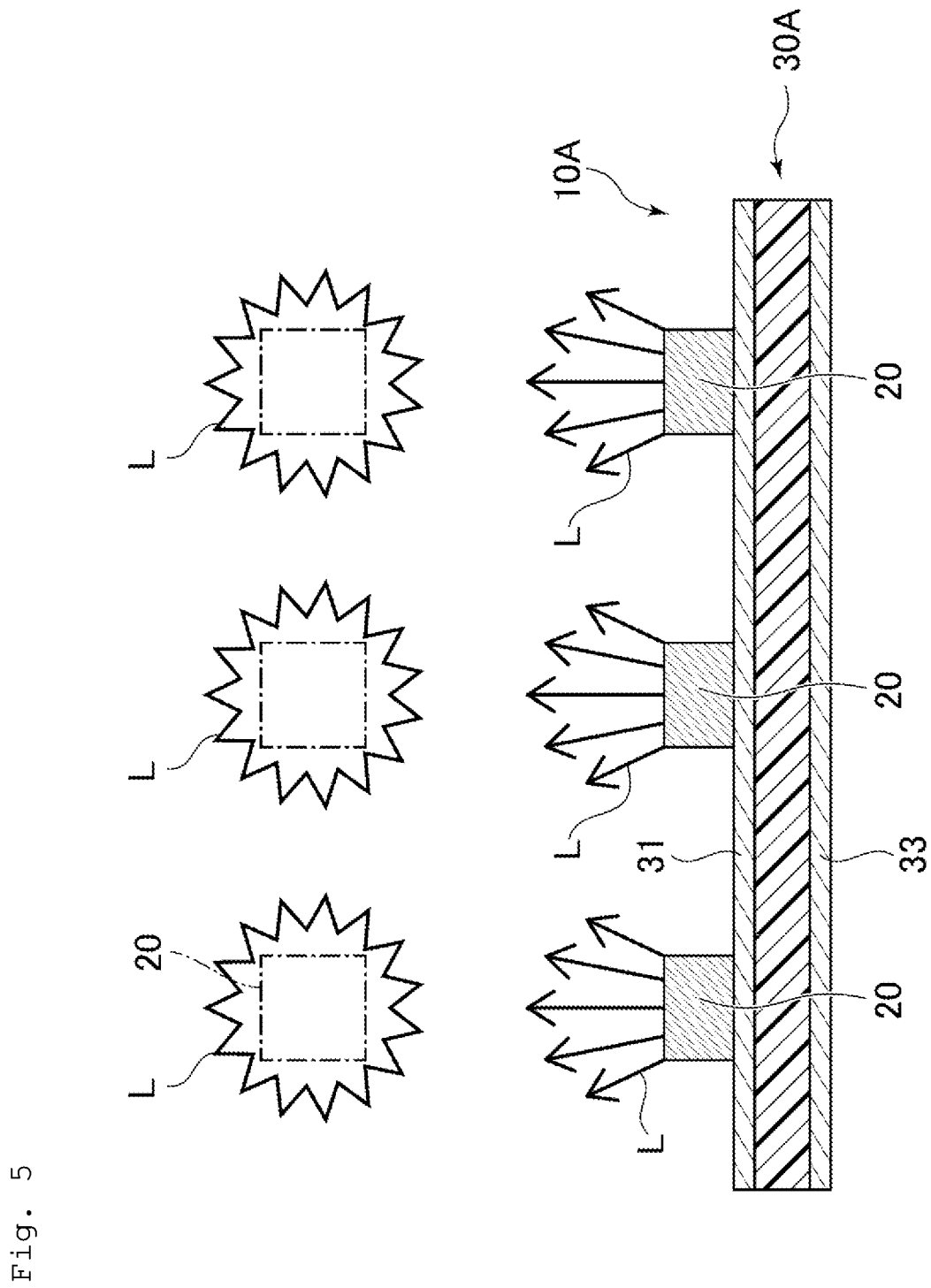
FIG. 5 is a diagram for explaining a light emitting operation of a light emitting substrate of a first comparative embodiment.

The first effect will be described by comparing the present embodiment with a first comparative embodiment (see FIG. 5) described below. Here, in the description of the first comparative embodiment, in a case of using the same constituent elements and the like as in the present embodiment, the same names, symbols, and the like as in the case of the present embodiment are used for the constituent elements and the like. FIG. 5 is a diagram for explaining the light emitting operation of the light emitting substrate 10A of the first comparative embodiment. The light emitting substrate 10A of the first comparative embodiment (a substrate 30A on which the plurality of light emitting elements 20 are mounted) has the same configuration as the light emitting substrate 10 (phosphor substrate 30) of the present embodiment except that the phosphor layer 36 is not provided.

In the case of the light emitting substrate 10A of the first comparative embodiment, the light L emitted from each light emitting element 20 and incident to the front surface 31 of the substrate 30A is reflected or scattered without converting the wavelength. Accordingly, in the case of the substrate 30A of the first comparative embodiment, it is not possible to adjust the light to light having light emission color different from the light emitted by the light emitting element 20, in a case where the light emitting element 20 is mounted. That is, in a case of the light emitting substrate 10A of the first comparative embodiment, it is not possible to adjust the light to light having light emission color different from the light emitted by the light emitting element 20.

On the other hand, in the case of the present embodiment, when seen from the thickness direction of the insulating layer 32, the phosphor layer 36 is disposed on the surface 31 of the insulating layer 32 that is around each bonded surface 34A1 with each light emitting element 20. Accordingly, some of the light L emitted radially from each light emitting element 20 is incident to the phosphor layer 36, wavelength-converted by the phosphor layer 36, and irradiated to the outside. In this case, some of the light L radially emitted from each light emitting element 20 is incident to the phosphor layer 36 to excite the phosphor contained in the phosphor layer 36 and generate the excitation light.

Figure 6:
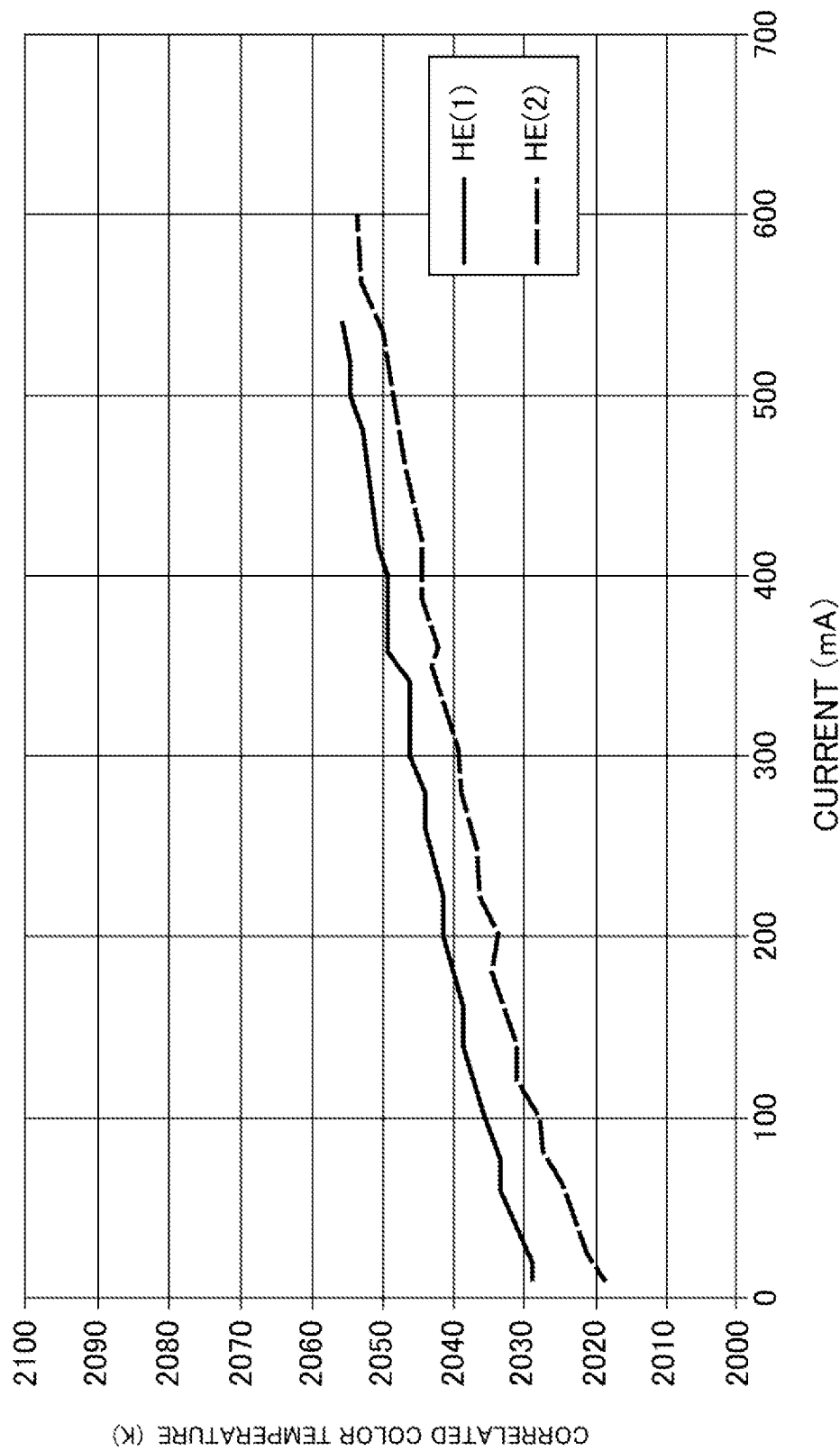
FIG. 6 is a graph showing a result of a first test of a correlated color temperature of the light emitting substrate of the present embodiment.
Figure 7:
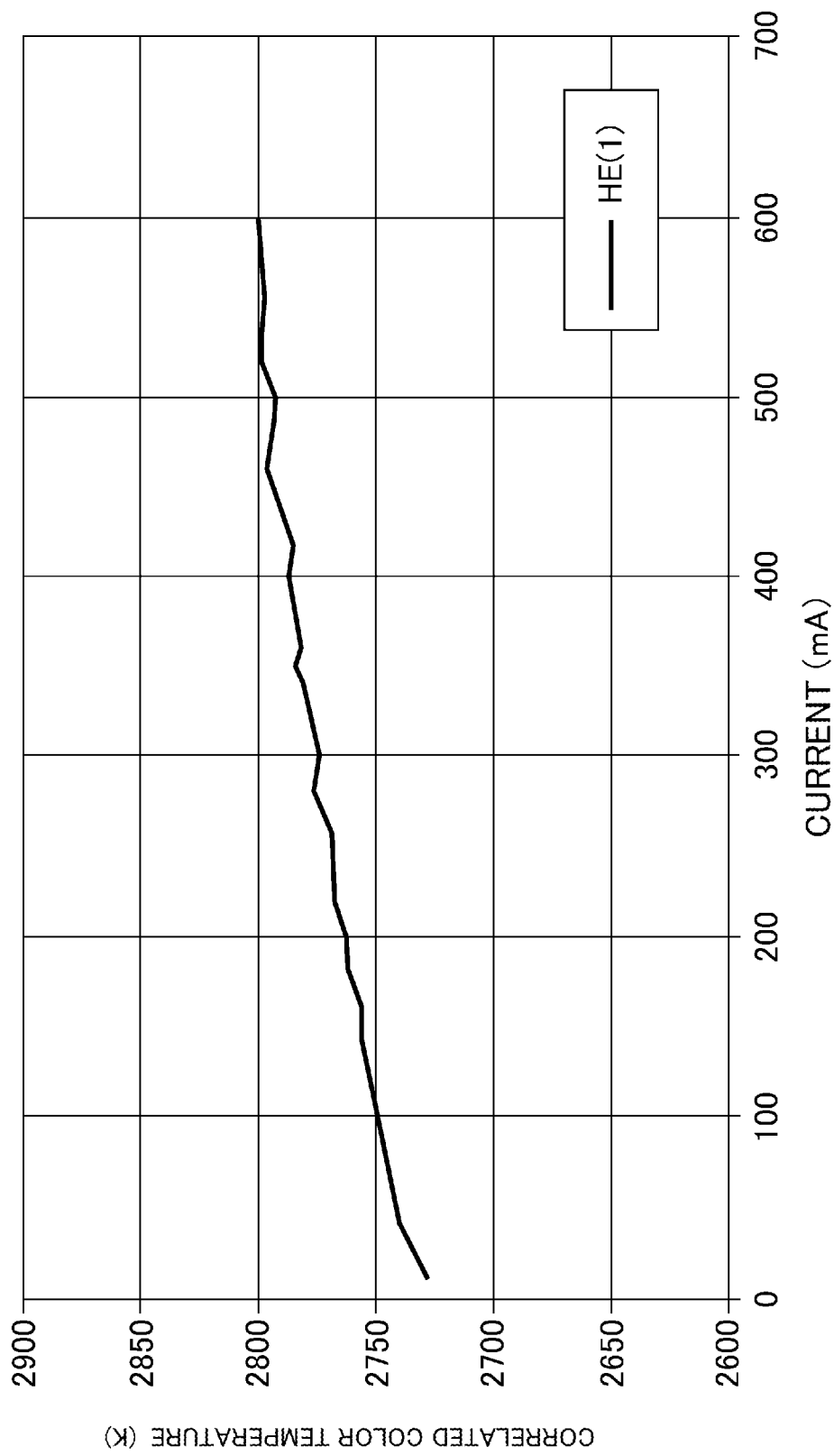
FIG. 7 is a graph showing a result of a second test of the correlated color temperature of the light emitting substrate of the present embodiment.

Here, FIG. 6 is a graph showing a result of a first test of the correlated color temperature of the light emitting substrate 10 of the present embodiment. In addition, FIG. 7 is a graph showing a result of the second test of the correlated color temperature of the light emitting substrate 10 of the present embodiment.

The first test is a test to obtain a result by investigating a relationship between a current (mA) and a correlated color temperature (K) of the plurality of light emitting elements 20, in a case where the power is supplied to the light emitting substrate 10 including the plurality of light emitting elements 20 having the correlated color temperature approximately at 2200 K to 2300 K to generate light. Here, HE (1) and HE (2) show two examples in a case where the structure of the electrode layer 34 is the same as that of the present embodiment. As the result of FIG. 6, in any case, the correlated color temperature of the light L emitted by the light emitting substrate 10 is lower than the correlated color temperature of the plurality of light emitting elements 20. That is, in the case of the present embodiment, the correlated color temperature could be shifted by providing the phosphor layer 36.

In addition, the second test is a test to obtain a result by investigating a relationship between a current (mA) and a correlated color temperature (K) of the plurality of light emitting elements 20, in a case where the power is supplied to the light emitting substrate 10 including the plurality of light emitting elements 20 having the correlated color temperature approximately at 2900 K to 3000 K to generate light. Here, HE (1) shows a case where the structure of the electrode layer 34 is the same as that of the present embodiment. As the result of FIG. 7, the correlated color temperature of the light L emitted by the light emitting substrate 10 is lower than the correlated color temperature of the plurality of light emitting elements 20. That is, in the case of the present embodiment, the correlated color temperature could be shifted by providing the phosphor layer 36.

Therefore, according to the phosphor substrate 30 of the present embodiment, in a case where the light emitting element 20 is mounted, it is possible to adjust the light L emitted from the phosphor substrate 30 to light having a light emission color different from the light L emitted by the light emitting element 20. Along with this, according to the light emitting substrate 10 of the present embodiment, it is possible to adjust the light L emitted from the phosphor substrate 30 to the light L having a light emission color different from the light L emitted by the light emitting element 20. From another point of view, according to the light emitting substrate 10 of the present embodiment, it is possible to irradiate the outside with light L having a light emission color different from the light L emitted by the light emitting element 20.

Second Effect

In the case of the first comparative embodiment, as shown in FIG. 5, spots are generated in the light L irradiated to the outside due to an arrangement interval of each light emitting element 20. Here, the larger the spot of light L, the larger the glare.

On the other hand, in a case of the present embodiment, as shown in FIG. 2B, the periphery of each bonded surface 34A1 is surrounded (over the entire circumference) by the phosphor layer 36, and the phosphor layer 36 is also provided between the light emitting elements 20 adjacent to each other. Therefore, the excitation light is also emitted from the periphery of each bonded surface 34A1 (periphery of each light emitting element 20).

Therefore, according to the present embodiment, it is possible to reduce the glare, compared to the first comparative embodiment.

In particular, this effect is effective, in a case where the phosphor layer 36 is provided over the entire surface of the insulating layer 32, specifically, in a case where a region of the front surface 31 of the insulating layer 32 where the phosphor layer 36 is disposed is a region that is 80% or more of the front surface 13.

Third Effect

As described above, the plurality of light emitting elements 20 use a heat sink (not shown) and a cooling fan (not shown) during the light emitting operation to dissipate heat (cool) the phosphor substrate 30 to be, for example, room temperature to 50° C. to 100° C. Therefore, the electrode layer 34 and the insulating layer 32 are thermally expanded, and each light emitting element 20 is also thermally expanded. Due to a difference in coefficient of thermal expansion between the former and the latter, the substrate 30 configured with the insulating layer 32 and the electrode layer 34 is warped. As a result, a traveling direction of the light L emitted from the plurality of light emitting elements 20 and the phosphor layer 36 may be affected by the warpage. In addition, cracks may be generated on the phosphor layer 36 due to the warpage.

However, in the present embodiment, the warpage is suppressed by attaching a member having the same thermal behavior (expansion and contraction) (that is, a member having a similar shape) to the front and rear sides through the insulating layer 32. In a case where a Cu pattern is applied only on the surface 31 side, stress and warpage occur on a material interface having different thermal behaviors, but the warpage is forcibly eliminated by sandwiching it on both sides. Along with this, the light emitting substrate 10 of the present embodiment is unlikely to fail. In addition, the light emitting substrate 10 of the present embodiment can stabilize the light emission from the plurality of light emitting elements 20 and the phosphor layer 36.

In the case of the present embodiment, a percentage of the first arrangement region (the arrangement region of the electrode layer 34) to the surface 31 of the insulating layer 32 is equal to or more than 60% (see FIG. 2A). Accordingly, the wiring portion 34B (see FIG. 2A), which occupies most of the electrode layer 34, is provided with a heat dissipation function. That is, the present embodiment is effective in that the electrode layer 34 and the rear surface pattern layer 38 cooperate with each other to effectively dissipate the heat generated by the plurality of light emitting elements 20.

Further, in the present embodiment, a region of at least a part (equal to or more than 80%) of the first arrangement region overlaps with the rear surface pattern layer 38 in the thickness direction of the insulating layer 32. Therefore, it can be said that it is effective in that the heat of the insulating layer 32 can be efficiently dissipated (radiated) from both sides in the thickness direction.

Further, in the present embodiment, the area of the second arrangement region is 90% to 110% of the area of the first arrangement region. That is, the rear surface pattern layer 38 is in contact with the insulating layer 32 in a region substantially equal to (about ±10%) that of the electrode layer 34. Therefore, the heat of the insulating layer 32 can be efficiently dissipated from the front surface 31 side and the rear surface 33 side of the insulating layer 32.

Fourth Effect

As described above, the phosphor substrate 30 and the plurality of light emitting elements 20 disposed on the phosphor substrate 30 of the present embodiment are heated to, for example, 250° C. during the fifth step (reflow step) during manufacturing. (see FIG. 3E). Therefore, the phosphor substrate 30 is thermally expanded, and each light emitting element 20 is also thermally expanded. Due to a difference in coefficient of thermal expansion between the former and the latter, the insulating layer 32 (phosphor substrate 30) is warped. As a result, mounting defects of the plurality of light emitting elements 20 may occur.

However, in the case of the present embodiment, warpage is suppressed by using electrode layers having the same physical properties and structure on the front surface 31 and the rear surface 33, and the thermal stress between the insulating layer 32 and the light emitting element 20 (CSP) is suppressed by setting the respective coefficients of thermal expansion thereof to be the same or substantially the same as each other. Along with this, according to the present embodiment, manufacturing defects hardly occur.

The above is the description of the effect of the present embodiment.

As described above, the present invention has been described with reference to the embodiments and examples described above, but the present invention is not limited to the embodiments and examples described above. The technical scope of the present invention also includes, for example, the following embodiments (modification example).

For example, in the description of the present embodiment, an example of the light emitting element 20 is a CSP. However, an example of the light emitting element 20 may be other than the CSP. For example, it may simply be equipped with a flip chip. In addition, it can also be applied to the substrate itself of a COB device.

In addition, in the description of the present embodiment, the surface of the phosphor layer 36 on the outer side in the thickness direction of the insulating layer 32 was positioned on the outer side in the thickness direction, compared to the bonded surface 34A1 of the electrode layer 34 (see FIG. 1C). However, considering a mechanism for describing the first effect described above, it is clear that, although the surface of the phosphor layer 36 on the outer side in the thickness direction of the insulating layer 32 is positioned at the same portion in the thickness direction as the bonded surface 34A1 of the electrode layer 34 or positioned on an inner side in the thickness direction, compared to the bonded surface 34A1, the first effect is exhibited.

In addition, in the description of the present embodiment, the phosphor layer 36 is, for example, disposed on a portion of the front surface 31 of the insulating layer 32 and the electrode layer 34, other than the plurality of electrode pairs 34A (see FIG. 2B). However, considering a mechanism for explaining the first effect described above, it is clear that the first effect is exhibited, even if the phosphor layer is not disposed over the entire region of the portion of the front surface 31 of the phosphor substrate 30 other than the plurality of electrode pair 34A. Therefore, even if the embodiment is different from the phosphor substrate 30 and the light emitting substrate 10 of the present embodiment only in that the phosphor layer 36 is disposed in a range of the front surface 31 different from that of the present embodiment, it can be said that this embodiment belongs to the technical scope of the present invention.

In addition, in the description of the present embodiment, it has been described that CS-3305A manufactured by Risho Kogyo Co., Ltd. is used as the motherboard MB in manufacturing the phosphor substrate 30 and the light emitting substrate 10. However, this is merely an example, and different motherboard MBs may be used. For example, the thickness of the insulating layer, the thickness of the copper foil, and the like may not be limited to the standard specifications of those of CS-3305A manufactured by Risho Kogyo Co., Ltd., and particularly, the thickness of the copper foil may be thicker.

The light emitting substrate 10 of the present embodiment (including the modification example thereof) can be applied to a lighting device in combination with other constituent elements. Other constituent elements in this case are a power source that supplies electric power for causing the light emitting element 20 of the light emitting substrate 10 to emit light, and the like.

In addition, in the present embodiment, it is described that the rear surface pattern layer 38 (configured with the plurality of portions 38A) is dummy electrodes which are not electrically connected to the plurality of electrode pairs 34A included in the electrode layer 34 on the surface 31 side. However, the rear surface pattern layer 38 is connected to the electrode layer 34 of the front surface 31 through, for example, a through hole (not shown), and the rear surface pattern layer 38 may be configured as apart of an electric path for supplying electric power to the electrode layer 34 or configured as a part of a heat dissipation route.

In addition, it is described that the rear surface pattern layer 38 is disposed on the rear surface 33 of the phosphor substrate 30 of the present embodiment. However, as in the phosphor substrate 30A (light emitting substrate 10A) of the modification example of FIG. 8, the rear surface pattern layer 38 may not be provided on the rear surface 33.

This application claims priority based on Japanese Patent Application No. 2018-244546 filed on Dec. 27, 2018, the entire disclosure of which is incorporated herein.

The invention claimed is:

1. A phosphor substrate having a plurality of light emitting elements mounted on one surface, the phosphor substrate comprising:
an insulating substrate;
a first electrode group which is disposed on one surface of the insulating substrate and includes a plurality of electrodes bonded to the plurality of light emitting elements; and
a phosphor layer which is disposed on one surface of the insulating substrate and includes a phosphor in which a light emission peak wavelength, in a case where light emitted by the light emitting element is used as excitation light, is in a visible light region,
wherein
the insulating substrate contains a bismaleimide resin and glass cloth, and
the phosphor layer does not cover the light emitting elements.

2. The phosphor substrate according to claim 1, further comprising:
a second electrode group which is disposed on the other surface of the insulating substrate and includes a plurality of electrodes.

3. The phosphor substrate according to claim 1,
wherein each of coefficients of thermal expansion in a vertical direction and a horizontal direction of the insulating substrate is equal to or less than 10 ppm/° C. in a range equal to or higher than 50° ° C. and equal to or lower than 100° C.

4. The phosphor substrate according to claim 1,
wherein a glass transition temperature of the insulating substrate is higher than 300° C.

5. The phosphor substrate according to claim 1,
wherein a storage elastic modulus of the insulating substrate is more than $1.0 \times 10^{10}$ Pa and less than $1.0 \times 10^{11}$ Pa in a range equal to or higher than 100° C. and equal to or lower than 300° C.

6. The phosphor substrate according to claim 2,
wherein the plurality of electrodes included in the second electrode group are dummy electrodes electrically not connected to the plurality of electrodes included in the first electrode group.

7. The phosphor substrate according to claim 2,
wherein the second electrode group forms a pattern.

8. The phosphor substrate according to claim 1,
wherein a thickness of the insulating substrate is equal to or less than 200 μm.

9. The phosphor substrate according to claim 8,
wherein the thickness of the insulating substrate is equal to or more than 100 μm.

10. The phosphor substrate according to claim 1,
wherein the light emitting element is formed as a chip sized package (CSP) in which an LED is incorporated.

11. A light emitting substrate comprising:
the phosphor substrate according to claim 1; and
the plurality of light emitting elements, which are respectively bonded to the plurality of electrodes of the first electrode group.

12. A lighting device comprising:
the light emitting substrate according to claim 11; and
a power source which supplies electric power for causing the light emitting element to emit light.

13. The phosphor substrate according to claim 2, wherein
the first electrode group is provided in a first arrangement region covering more than 60% of the one surface of the insulating substrate,
the second electrode group is provided in a second arrangement region on the other surface of the insulating substrate, and
80% or more of the first arrangement region overlaps the second arrangement region.

* * * * *